(12) United States Patent
Murayama

(10) Patent No.: US 7,061,261 B2
(45) Date of Patent: Jun. 13, 2006

(54) SEMICONDUCTOR INSPECTION DEVICE AND METHOD FOR MANUFACTURING CONTACT PROBE

(75) Inventor: Kei Murayama, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 11/036,314

(22) Filed: Jan. 14, 2005

(65) Prior Publication Data

US 2005/0156614 A1    Jul. 21, 2005

(30) Foreign Application Priority Data

Jan. 16, 2004   (JP) ............................. 2004-009614

(51) Int. Cl.
*G01R 31/02*    (2006.01)

(52) U.S. Cl. ...................... 324/758; 324/754; 324/761

(58) Field of Classification Search ................ 324/754, 324/761, 762, 765; 439/482, 824
See application file for complete search history.

(56) References Cited

U.S. PATENT DOCUMENTS

| | | | |
|---|---|---|---|
| 4,520,314 A | 5/1985 | Asch et al. | |
| 4,574,235 A * | 3/1986 | Kelly et al. | ................. 324/754 |
| 5,172,050 A | 12/1992 | Swapp | |
| 6,359,455 B1 | 3/2002 | Takekoshi | |

FOREIGN PATENT DOCUMENTS

| | | |
|---|---|---|
| JP | 7 007052 | 1/1995 |
| JP | 11-126800 | 5/1999 |
| JP | 2001-255340 | 9/2001 |
| JP | 2002-168904 | 6/2002 |
| JP | 2003 227847 | 8/2003 |

\* cited by examiner

*Primary Examiner*—Vinh Nguyen
*Assistant Examiner*—Arleen M. Vazquez
(74) *Attorney, Agent, or Firm*—Ladas & Parry LLP

(57) ABSTRACT

A semiconductor inspection device for inspecting an electronic device is disclosed. The semiconductor inspection device includes a contact probe including a plurality of column parts disposed in continuation, each of the column parts having different height, a conductive layer formed at least on the surfaces of the column parts, a holding part for holding the contact probe, and a through-hole electrode penetrating at least one of the column parts, wherein the contact probe and the holding part are integrally formed from a single silicon substrate.

3 Claims, 45 Drawing Sheets

SEMICONDUCTOR INSPECTION DEVICE AND METHOD FOR MANUFACTURING CONTACT PROBE

BACKGROUND OF THE INVENTION

1. Field of the Invention

The present invention generally relates to a semiconductor inspection device and a method for manufacturing a contact probe, and more particularly, to a semiconductor inspection device including a contact probe that is electrically connected to a terminal part of an electronic device when inspecting the electronic device and a method for manufacturing the contact probe.

2. Description of the Related Art

Along with high densification of semiconductor devices in recent years, external connection terminals for semiconductor devices are provided with an increasingly large number of pins. At the same time, there is also a demand for further size-reduction of semiconductor devices. Therefore, semiconductor devices are desired to have a highly dense arrangement of external connection terminals. As a known package for satisfying such desire, there is, for example, a BGA (Ball Grid Array) and a CSP (Chip Size Package).

The BGA (Ball Grid Array) and the CSP (Chip Size Package) have its bottom surface part provided with a grid-like array of solder balls. By disposing the solder balls in a grid-like manner, the pitch of the solder balls can be arranged with a narrower pitch. This enables high densification and size-reduction of the semiconductor device. Furthermore, since a high reliability is required for the semiconductor device, a reliability inspection is performed on the semiconductor device before shipment. In the reliability test, the semiconductor device is tested by actually supplying a test signal to the semiconductor device. Accordingly, contact probes connected to a tester is connected to the solder balls of the semiconductor device.

FIG. 1 is a drawing showing a contact probe according to a conventional technology. A contact probe 10, being generally referred to as a pogo pin, is illustrated in FIG. 1. The contact probe 10 mainly includes a shaft part 11, an upper part plunger 12 for connecting to the solder balls of the BGA, a lower part plunger 13 for connecting to an inspection apparatus (tester), and coil springs 14.

The coil springs 14 are disposed between the upper and lower plungers 12, 13. The coil springs 14 allow the upper part plunger 12 to be displaceable in a vertical direction (arrow direction in FIG. 1) with respect to the lower part plunger 13. Furthermore, a housing 15 is formed with a through-hole for disposing the contact probe 10 therein (See, for example, Japanese Laid-Open Patent Application No.2001-255340).

FIG. 2 is a drawing showing a wire-shaped contact probe according to a conventional technology. In FIG. 2, A contact probe 20 includes a soft core 21 and a hard shell 22 disposed in a manner encasing the soft core 21. The soft core 21 is formed with a wire bonding technique. The hard shell 22 is formed with a plating method (See, for example, Japanese Laid-Open Patent Application No.11-126800).

However, since the contact probe 10 employs mechanical components such as the coil springs, the contact probe 10 has a difficulty in disposing the contact probe 10 in a narrow pitch. Furthermore, since the contact probe 10 is hand-manufactured, the contact probe 10 has poor process precision, requires large manufacture cost, and is unable to be mass-produced. In addition, the contact probe 10 requiring a large number of components further increases the manufacture cost.

With the contact probe 20 formed by the wire-bonding technique, it is difficult to disposed the contact probe 20 in a narrow pitch since the contact probe 20 is formed with a complicated shape. Furthermore, owing to the wire shape of the contact probe 20, the contact probe 20 is liable to be subject to problems as permanent set in fatigue and/or plastic deformation.

SUMMARY OF THE INVENTION

It is a general object of the present invention to provide a semiconductor inspection device and a method for manufacturing a contact probe that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor inspection device and a method for manufacturing a contact probe particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a semiconductor inspection device for inspecting an electronic device, the semiconductor inspection device including: a contact probe including a plurality of column parts disposed in continuation, each of the column parts having different height; a conductive layer formed at least on the surfaces of the column parts; a holding part for holding the contact probe; and a through-hole electrode penetrating at least one of the column parts; wherein the contact probe and the holding part are integrally formed from a single silicon substrate.

In the semiconductor inspection device according to an embodiment of the present invention, the column parts may be disposed on the silicon substrate in a spiral-like manner when observed from a plan view direction.

In the semiconductor inspection device according to an embodiment of the present invention, the holding part may include a frame body encompassing the column parts, wherein the frame body is integrally formed with at least one of the column parts of the contact probe, wherein the column parts each have a bottom face part that shares a same plane with respect to a bottom face part of the frame body.

Furthermore, the present invention provides a method of manufacturing a contact probe including N column parts disposed in continuation, each of the column parts having different height, the N column parts being supported by a holding part, the method including the steps of: a) forming an $N-1^{th}$ resist film on a portion of the silicon substrate corresponding to a position of the holding part and a portion of the silicon substrate corresponding to a position of an $N-1^{th}$ column part; b) forming an $N^{th}$ resist film on the $N-1^{th}$ resist film and a portion of the silicon substrate corresponding to a position of an $N^{th}$ column part, the $N^{th}$ resist film having a property different from that of the $N-1^{th}$ resist film; c) repeating the steps a) and b); d) etching a predetermined area to a predetermined depth by using the $N^{th}$ resist film as a mask and then removing the $N^{th}$ resist film; e) repeating the step d); and f) forming a conductive layer at least on the surfaces of the first to $N^{th}$ column parts.

Furthermore, the present invention provides a method of manufacturing a contact probe including first to fourth column parts disposed in continuation, each of the column parts having different height, the first to fourth column parts being supported by a holding part, the method including the steps of: a) forming a first resist film on a portion of a silicon substrate corresponding to the holding part and a portion of the silicon substrate corresponding to a position of the first column part; b) forming a second resist film on the first resist film and a portion of the silicon substrate corresponding to a position of the second column part, the second resist film having a property different from that of the first resist film; c) forming a third resist film on the second resist film and a portion of the silicon substrate corresponding to a position of the third column part, the third resist film having a property different from that of the second resist film; d) forming a fourth resist film on the third resist film and a portion of the silicon substrate corresponding to a position of the fourth column part, the fourth resist film having a property different from that of the third resist film; e) etching a first area to a first depth by using the fourth resist film as a mask and then removing the fourth resist film; f) etching a second area to a second depth by using the third resist film as a mask and then removing the third resist film; g) etching a third area to a third depth by using the second resist film as a mask and then removing the second resist film; h) etching a fourth area to a fourth depth by using the first resist film as a mask; and i) forming a conductive layer at least on the surfaces of the first to fourth column parts and filling a through-hole formed by the etching in the step h) with a conductive material.

In the method according to an embodiment of the present invention, the holding part may include a frame body encompassing the first to fourth column parts, wherein the frame body may be integrally formed with at least one of the first to fourth column parts of the contact probe.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

First Embodiment

Figure 1:
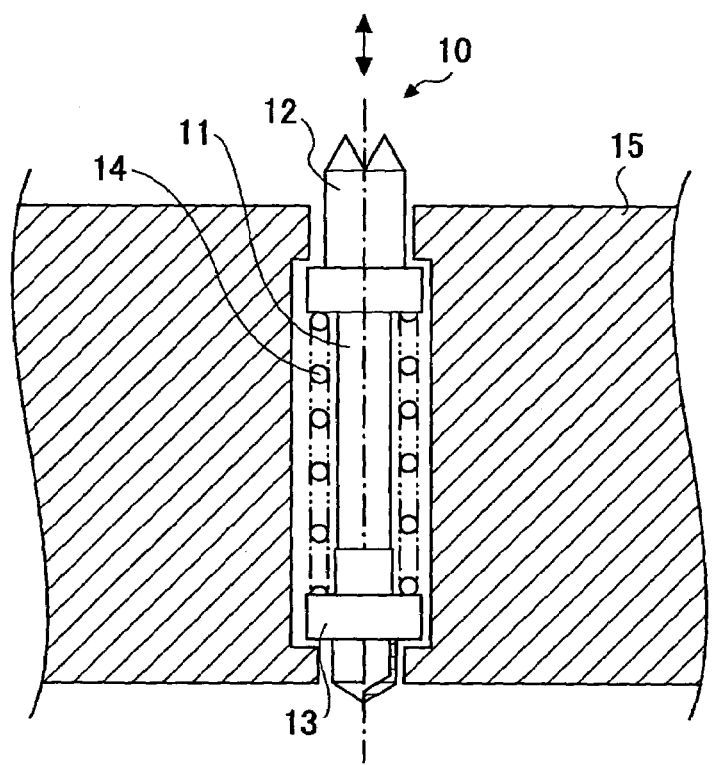
FIG. 1 is a drawing showing a conventional contact probe.
Figure 2:
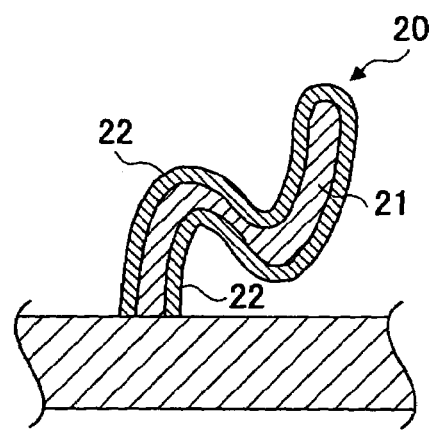
FIG. 2 is a drawing showing a conventional wire-shape contact probe.
Figure 3:
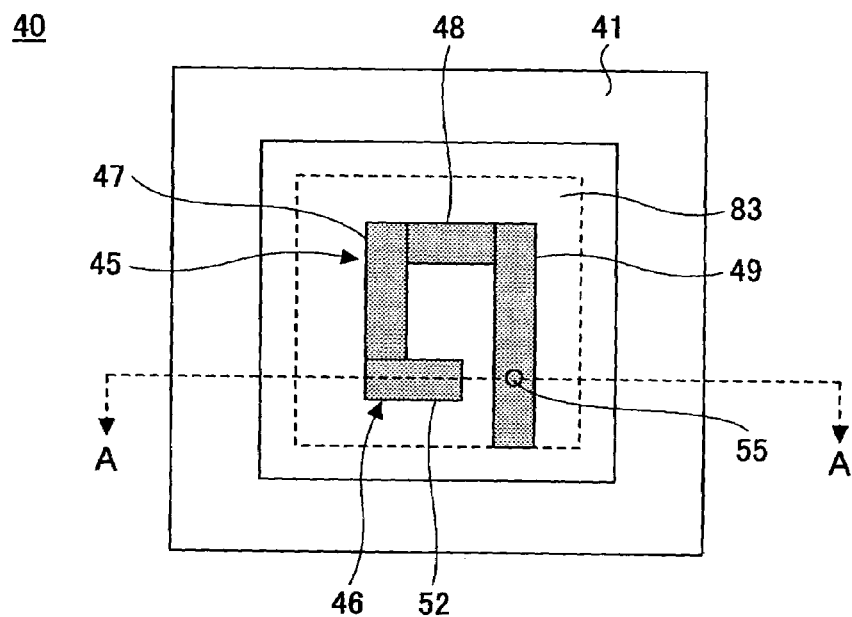
FIG. 3 is a plan view of a semiconductor inspection device including a contact probe according to a first embodiment of the present invention.
Figure 4:
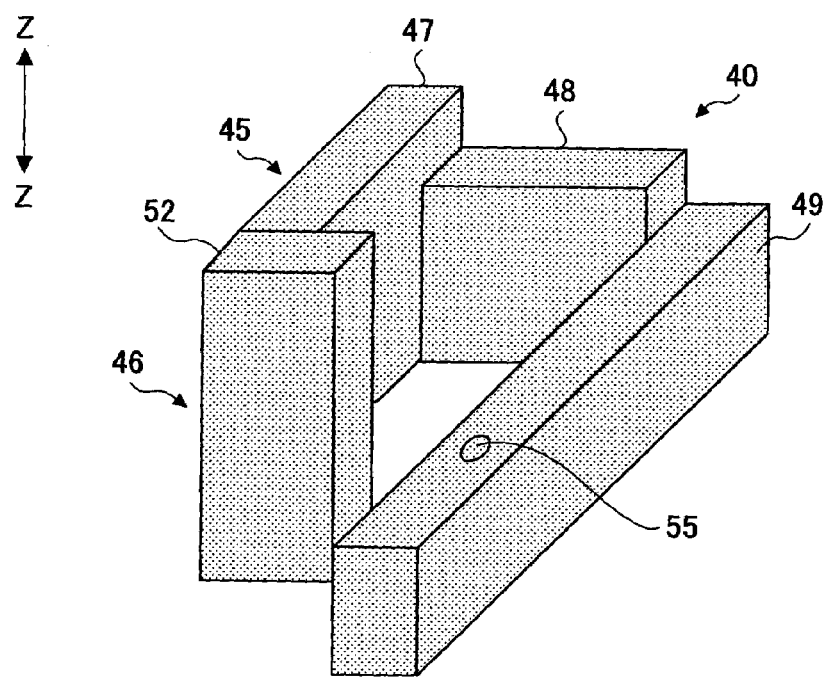
FIG. 4 is a perspective view of a contact probe shown in FIG. 3.
Figure 5:
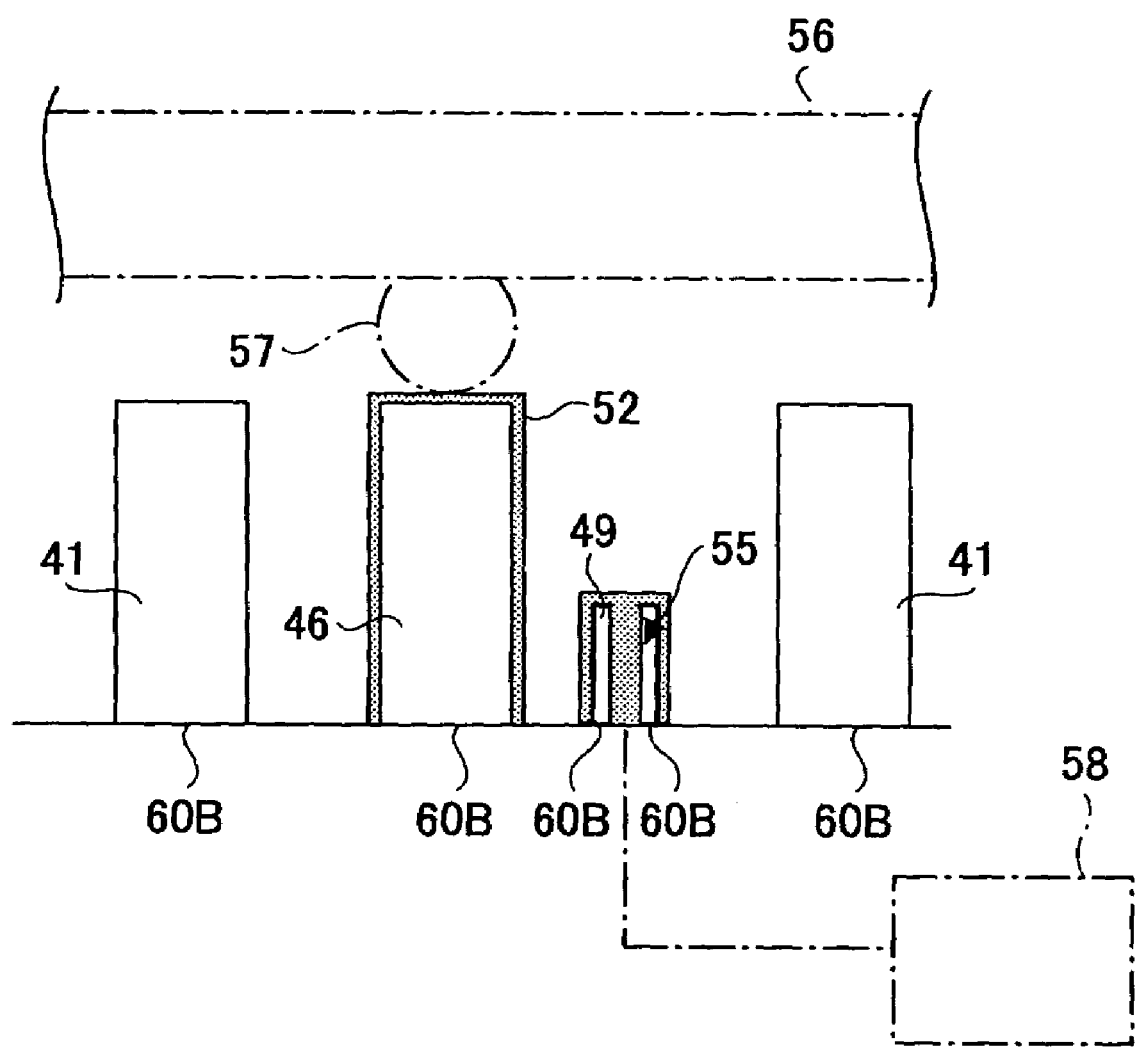
FIG. 5 is a cross-sectional view of a semiconductor inspection apparatus shown in FIG. 3 along line A—A of FIG. 3.

First, a semiconductor inspection device including a contact probe according to a first embodiment of the present invention is described with reference to FIG. 3 to FIG. 5. FIG. 3 is a plan view showing the semiconductor inspection device according to the first embodiment of the present invention, FIG. 4 is a perspective view of a contact probe shown in FIG. 3, and FIG. 5 is a cross-sectional view of the semiconductor inspection device along line A—A of FIG. 3. It is to be noted that the arrow direction Z—Z in FIG. 4 indicates a vertical direction. Numeral 60B shown in FIG. 5 indicates a back face of a contact probe 45 and a holding part 41 (hereinafter referred to as "rear face 60B").

A semiconductor inspection device 40 mainly includes the holding part 41, the contact probe 45, and a measuring part 58 (see FIG. 5). The contact probe 45 and the holding part 41 are integrally formed. The holding part 41 is formed as a frame body in a manner encompassing the contact probe 45, a through part 83 is formed between the contact probe 45 and the holding part 41. It is to be noted that, although not shown in the drawing, plural contact probes 45 are disposed in grid-like manner in the semiconductor inspection device 40.

The contact probe 45 mainly includes plural column parts (first column part 46 to fourth column part 49), a conductive layer (conductive metal layer) 52, and a through-hole electrode 55. The first-fourth column parts 46–49, having different height, are disposed in continuation, in which the first column part 46 is the most highest column part, the second column part 47 is the second highest column part, the third column part 48 is the third highest column part, and the fourth column part 49 is the fourth highest column part. Furthermore, the first-fourth column parts 46–49 each have a bottom face part (rear face 60B) which shares a same plane.

In a plan view of the first-fourth column parts 46–49 (See FIG. 3), the first-fourth column parts 46–49 are arranged forming a spiral-like shape. The contact probe 45 is supported in a cantilever manner by the holding part 41 via the fourth column part 49.

Thus structured, the contact probe 45 is able to attain a spring-like property with respect to the frame body-shaped holding part 41. Accordingly, when the contact probe 45 is contacted to a terminal part 57 of an electronic device 56, plastic deformation of the contact probe 45 can be reduced, thereby extending the lifetime of the contact probe 45. Furthermore, since the first-fourth column parts 46–49 support each other by arranging the first-fourth column parts 46–49 in the spiral-like manner, the strength of the contact probe 45 can be increased.

The conductive layer 52 is formed at least on the surfaces of the first-fourth column parts 46–49. The fourth column part 49, which is lowest in height, includes the through-hole electrode 55 being formed in a through-hole penetrating the fourth column part 49 in direction Z—Z. The through-hole electrode 55 is formed simultaneously with the forming of the conductive layer 52. The through-hole electrode 55 serves to electrically connect the rear face 60B and the conductive layer 52. The measuring part 58 is electrically connected to the through-hole electrode 55. The measuring part 58 is used in inspecting an electronic device 56 based on input-output signals from the electronic device 56. As for the electronic device 56 being the target for inspection, other semiconductor elements may be employed as alternatives of the CSP or the BGA.

The inspection of the electronic device 56, using the semiconductor inspection device 40, is performed by abutting the terminal part 57 of the electronic device 56 to the conductive layer 56 formed at an upper face part of the first column part 46 and electrically connecting the measuring part 58 and the electronic device 56 via the through-hole electrode 55.

Thus structured, the contact probe 45 and the holding part 41 is integrally formed with a single silicon substrate. As for the method for integral formation, a high precision processing technology used in processing semiconductor devices is employed (described in detail below). Accordingly, process precision can be improved, thereby enabling the contact probes 45 to be disposed in a narrower pitch compared to the conventional contact probe. In addition, the contact probes 45 can be mass produced at low cost. Furthermore, since a silicon substrate is employed as the material of the contact probe 45, plastic deformation of the contact probe 45 can be prevented more effectively compared to the conventional contact probe.

Figure 6:
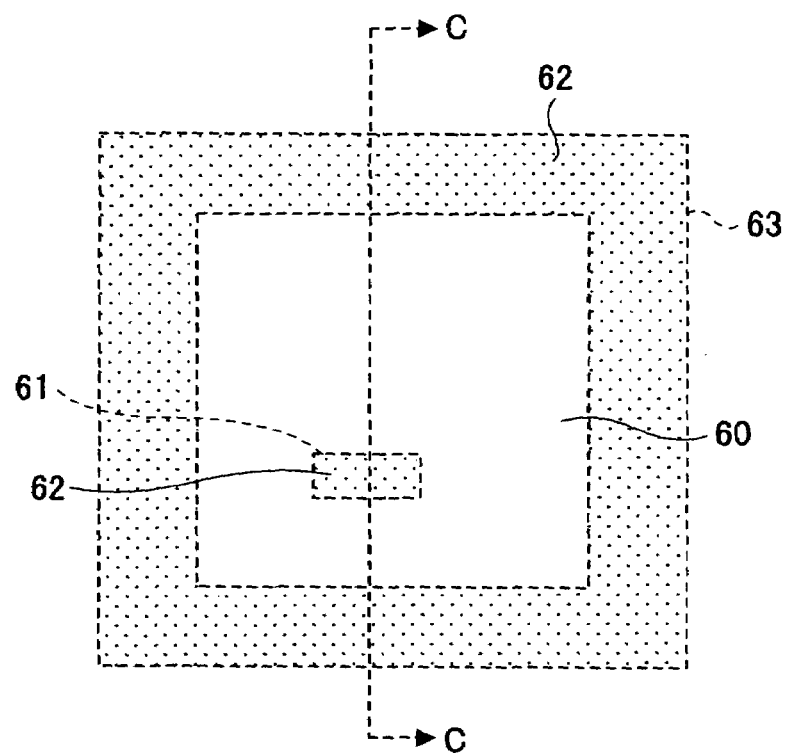
FIG. 6 is a plan view (part 1) showing a process of a manufacture method of a semiconductor inspection device according to a first embodiment of the present invention.
Figure 7:
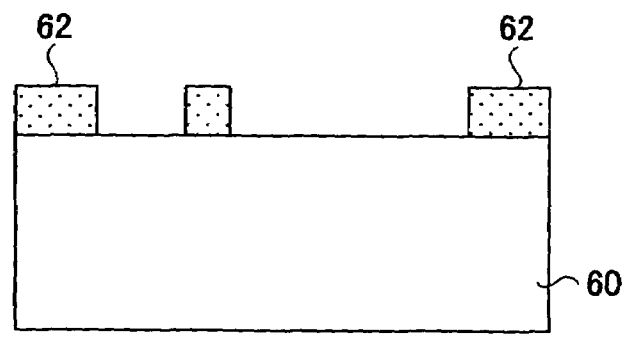
FIG. 7 is a cross-sectional view of a configuration shown in FIG. 6 along line C—C of FIG. 6.

Next, a method of manufacturing the semiconductor inspection device 40 including the contact probe 45 according to the first embodiment of the present invention is described with reference to FIGS. 6–40. FIG. 6 is a plan view (part 1) showing a process of the manufacture method of the semiconductor inspection device according to the first embodiment of the present invention. FIG. 7 is a cross-sectional view of the configuration shown in FIG. 6 along line C—C of FIG. 6.

As shown in FIGS. 6 and 7, a first resist film 62 is formed on an area 63 of the silicon substrate 60 corresponding to the holding part 41 and on an area 61 of the silicon substrate 60 corresponding to the first column part 46. As a preferable example of the first resist film 62, a liquid resist containing, for example, a phenolic resin as a main component, a melamine and/or epoxy resin as a sub-component, and a photosensitive agent may be employed, in which the resist is coated and is then heated.

Figure 8:
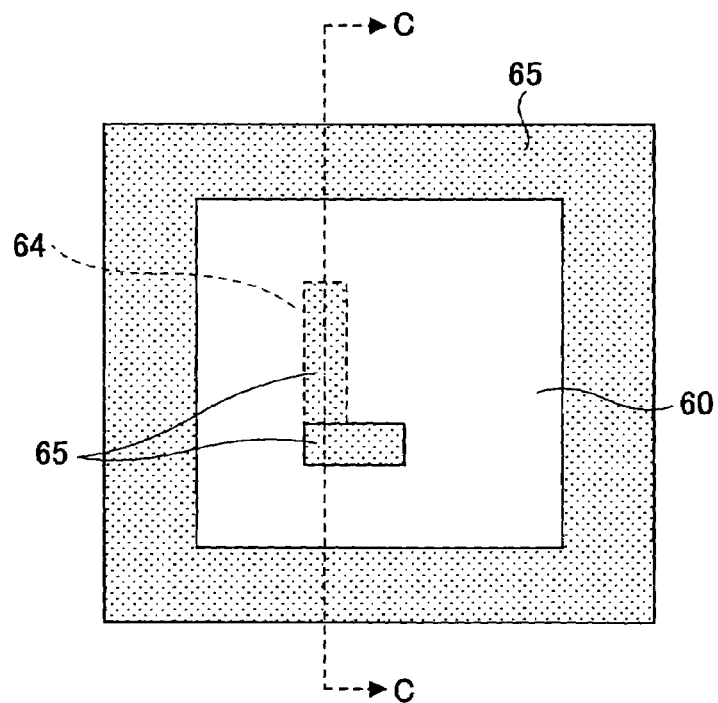
FIG. 8 is a plan view (part 2) showing a process of a manufacture method of a semiconductor inspection device according to a first embodiment of the present invention.
Figure 9:
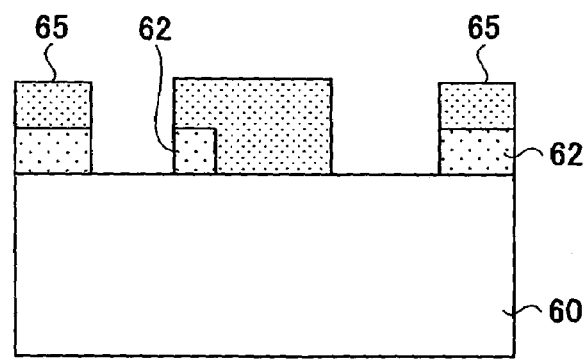
FIG. 9 is a cross-sectional view of a configuration shown in FIG. 8 along line C—C of FIG. 8.

FIG. 8 is a plan view (part 2) showing a process of the manufacture method of the semiconductor inspection device according to the first embodiment of the present invention. FIG. 9 is a cross-sectional view of the configuration shown in FIG. 8 along line C—C of FIG. 6.

Next, as shown in FIGS. 8 and 9, a second resist film 65, having a property different from that of the first resist film 62, is formed on an area 64 of the silicon substrate 60 corresponding to the second column part 47 and on the first resist film 62. As a preferable example of the second resist film 65, a liquid resist containing, for example, a novolac resin and/or naphthoquinone diazide dielectric as a main component may be employed.

Figure 10:
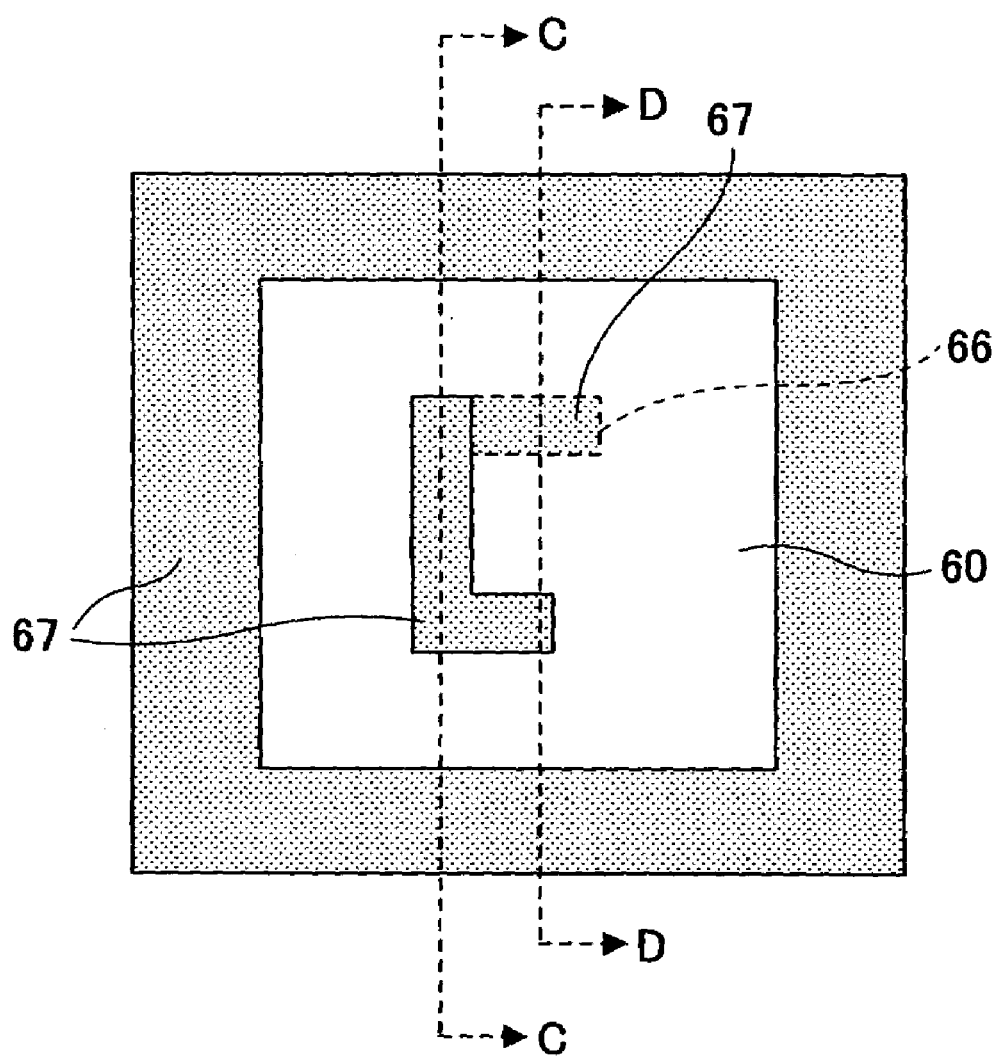
FIG. 10 is a plan view (part 3) showing a process of a manufacture method of a semiconductor inspection device according to a first embodiment of the present invention.
Figure 11:
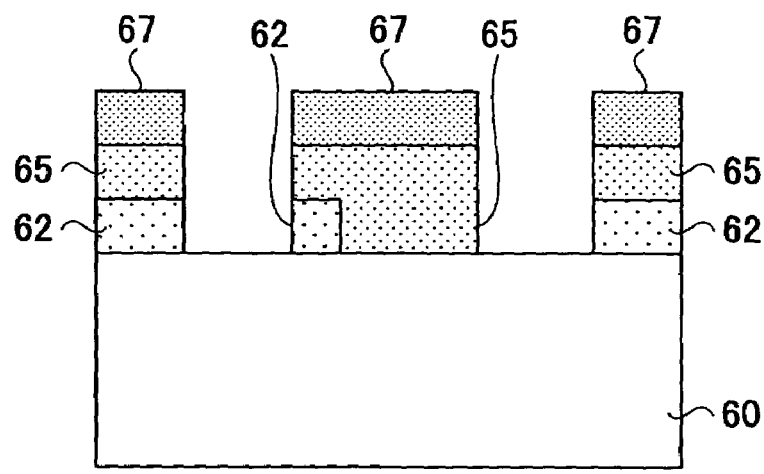
FIG. 11 is a cross-sectional view of a configuration shown in FIG. 10 along line C—C of FIG. 10.
Figure 12:
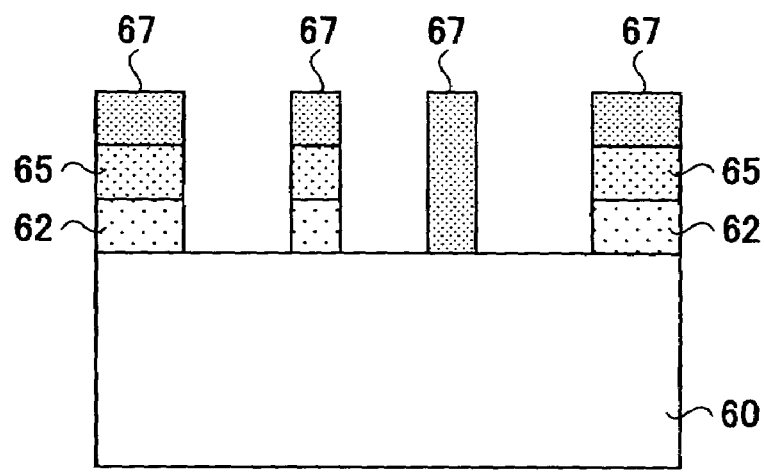
FIG. 12 is a cross-sectional view of a configuration shown in FIG. 10 along line D—D of FIG. 10.

FIG. 10 is a plan view (part 3) showing a process of the manufacture method of the semiconductor inspection device according to the first embodiment of the present invention. FIG. 11 is a cross-sectional view of the configuration shown in FIG. 10 along line C—C of FIG. 10. FIG. 12 is a cross-sectional view of the configuration shown in FIG. 10 along line D—D of FIG. 10.

Next, as shown in FIGS. 10 to 12, a third resist film 67, having a property different from that of the second resist film 65, is formed on an area 66 of the silicon substrate 60 corresponding to the third column part 48 and on the second resist film 65. As a preferable example of the third resist film 67, a liquid resist containing, for example, a phenolic resin as a main component, a melamine and/or epoxy resin as a sub-component, and a photosensitive agent may be employed, in which the resist is coated and is then heated.

Figure 13:
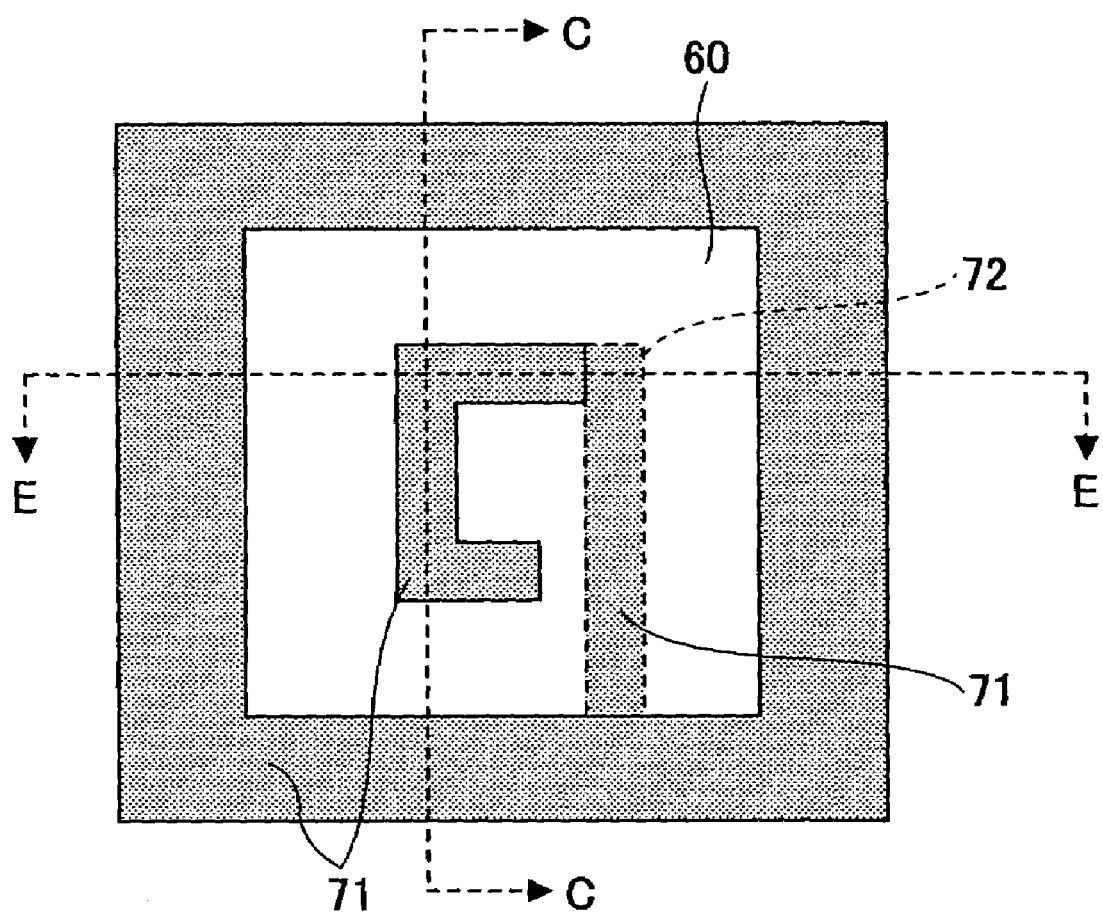
FIG. 13 is a plan view (part 4) showing a process of a manufacture method of a semiconductor inspection device according to a first embodiment of the present invention.
Figure 14:
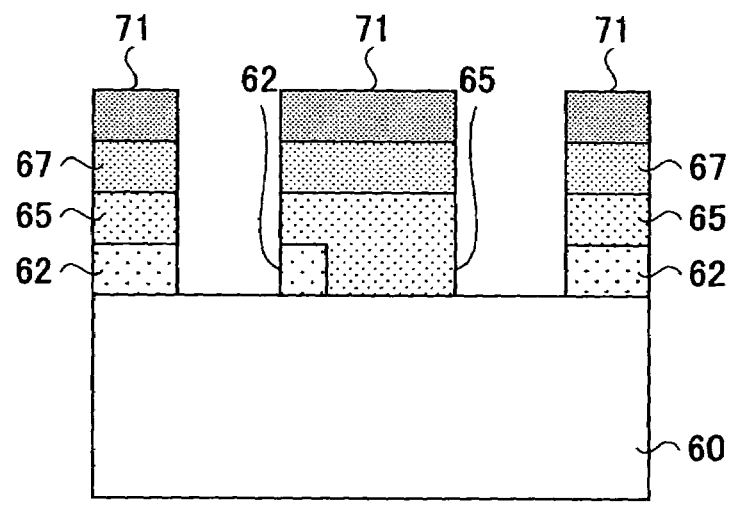
FIG. 14 is a cross-sectional view of a configuration shown in FIG. 13 along line C—C of FIG. 13.
Figure 15:
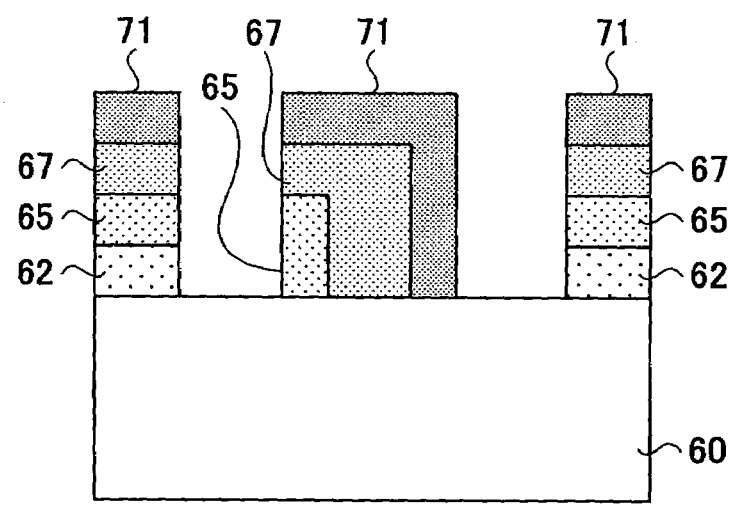
FIG. 15 is a cross-sectional view of a configuration shown in FIG. 13 along line E—E of FIG. 13.

FIG. 13 is a plan view (part 4) showing a process of the manufacture method of the semiconductor inspection device according to the first embodiment of the present invention. FIG. 14 is a cross-sectional view of the configuration shown in FIG. 13 along line C—C of FIG. 6. FIG. 15 is a cross-sectional view of the configuration shown in FIG. 13 along line E—E of FIG. 13.

Next, as shown in FIGS. 13 to 15, a fourth resist film 71, having a property different from that of the third resist film 67, is formed on an area 72 of the silicon substrate 60 corresponding to the fourth column part 49 and on the third resist film 67. Here, the fourth resist layer 71 at the area 62 corresponding to the fourth column part 49 and the fourth resist layer 71 situated at the area 63 corresponding to the holding part 41 are integrally formed in a continuing manner. Thereby, the fourth column part 49 can be supported by the holding part 49 during a first etching process using the fourth resist layer 71 as a mask. As a preferable example of the fourth resist film 71, a liquid resist containing, for example, a novolac resin and/or naphthoquinone diazide dielectric as a main component may be employed.

Figure 16:
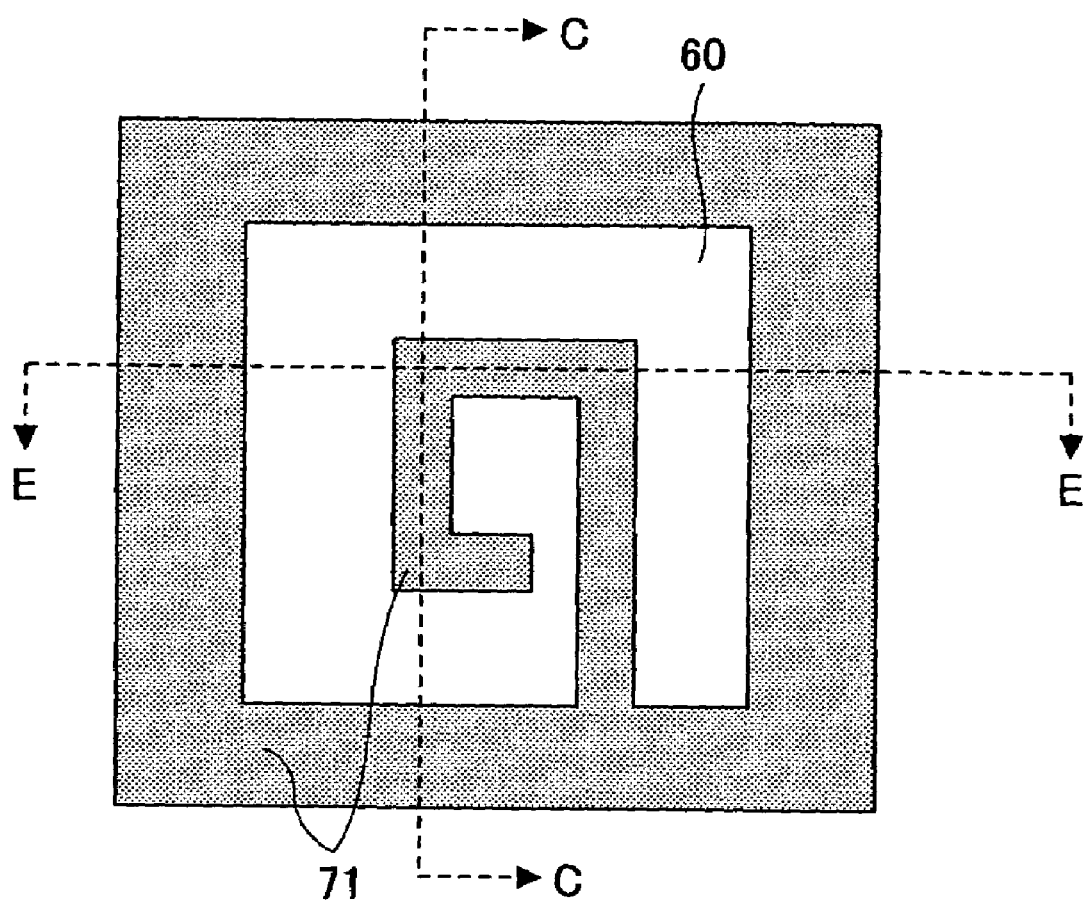
FIG. 16 is a plan view (part 5) showing a process of a manufacture method of a semiconductor inspection device according to a first embodiment of the present invention.
Figure 17:
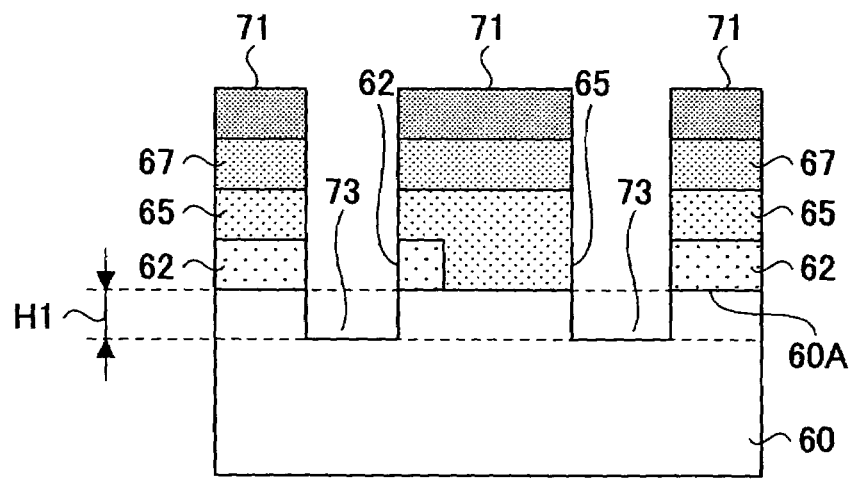
FIG. 17 is a cross-sectional view of a configuration shown in FIG. 16 along line C—C of FIG. 16.
Figure 18:
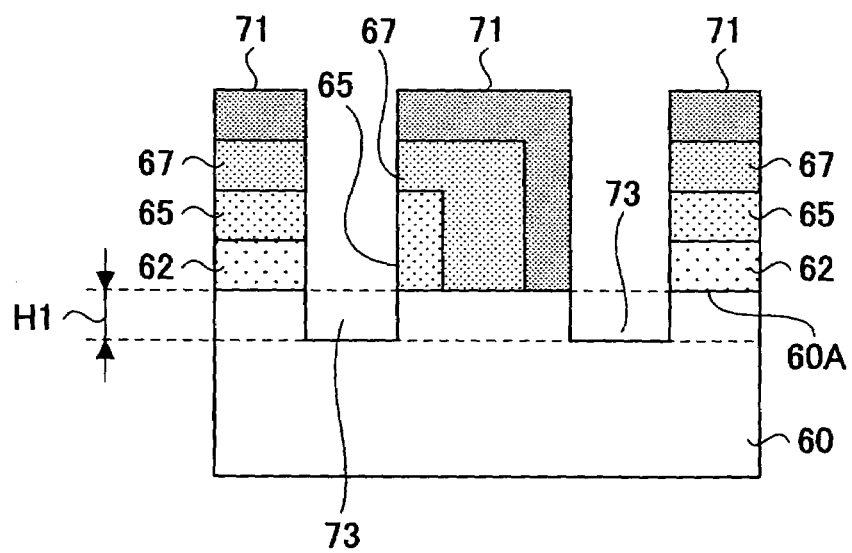
FIG. 18 is a cross-sectional view of a configuration shown in FIG. 16 along line E—E of FIG. 16.

FIG. 16 is a plan view (part 5) showing a process of the manufacture method of the semiconductor inspection device according to the first embodiment of the present invention. FIG. 17 is a cross-sectional view of the configuration shown in FIG. 16 along line C—C of FIG. 16. FIG. 18 is a cross-sectional view of the configuration shown in FIG. 16 along line E—E of FIG. 16. It is to be noted that H1 in FIGS. 17 and 18 indicates the depth of a groove part 73 formed by a first etching process (hereinafter referred to depth H1).

Next, as shown in FIGS. 16 to 18, the first etching process using the fourth resist layer 71 as a mask is performed on the silicon substrate 60 to form the groove part 73 having a depth H1 with respect to surface 60A of the silicon substrate 60. Then, the fourth resist film 71 is removed.

Figure 19:
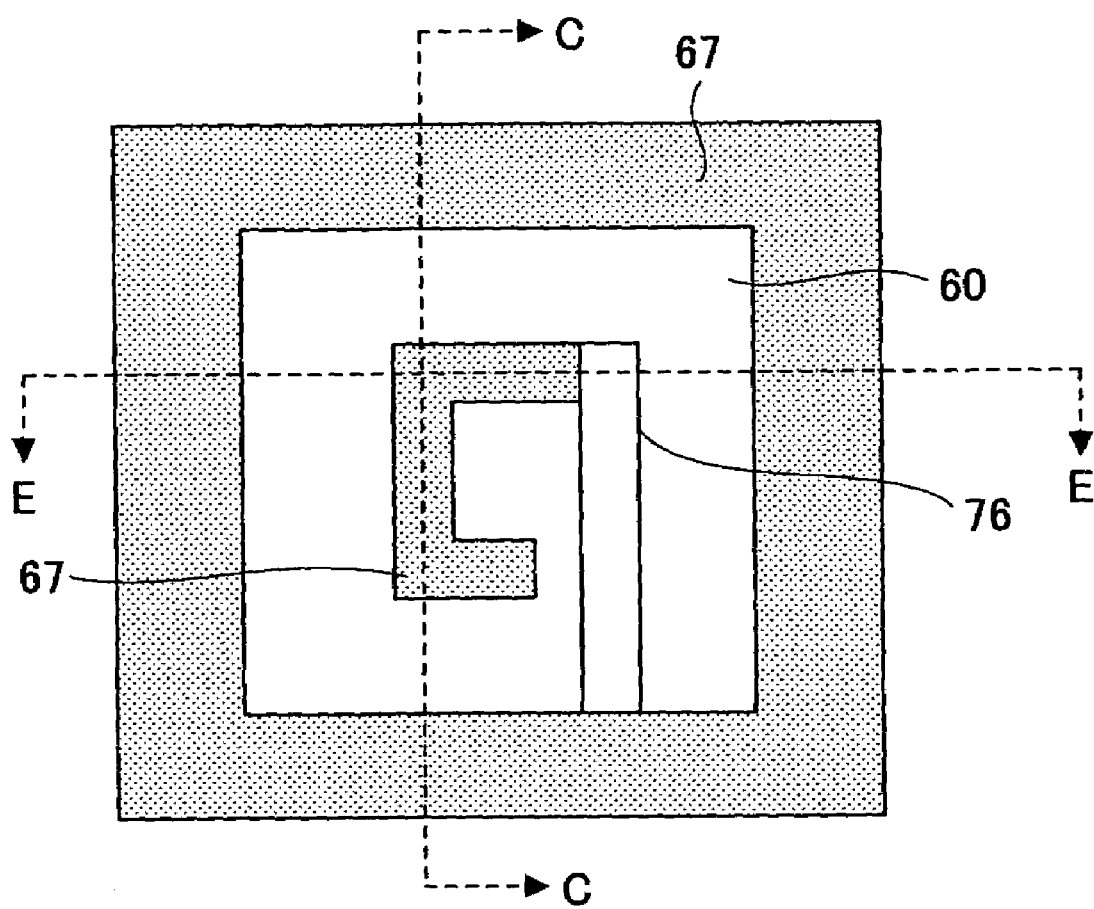
FIG. 19 is a plan view (part 6) showing a process of a manufacture method of a semiconductor inspection device according to a first embodiment of the present invention.
Figure 20:
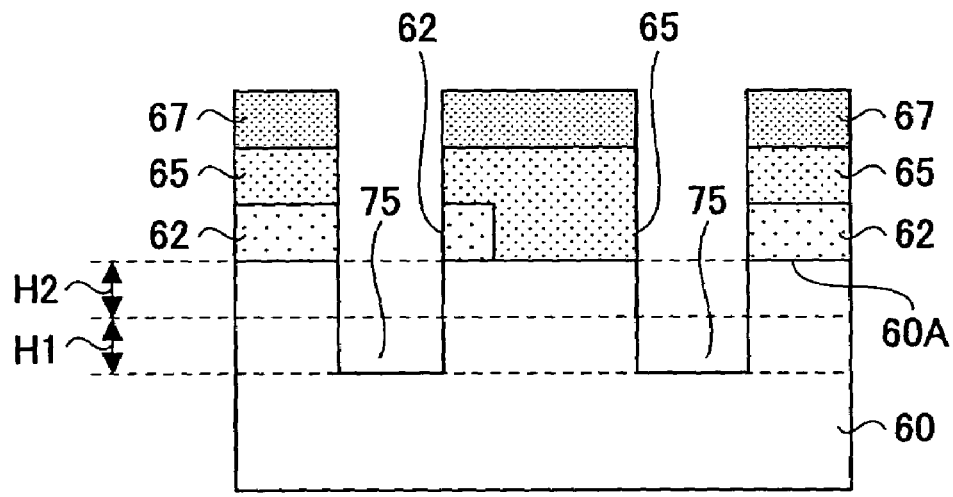
FIG. 20 is a cross-sectional view of a configuration shown in FIG. 19 along line C—C of FIG. 19.
Figure 21:
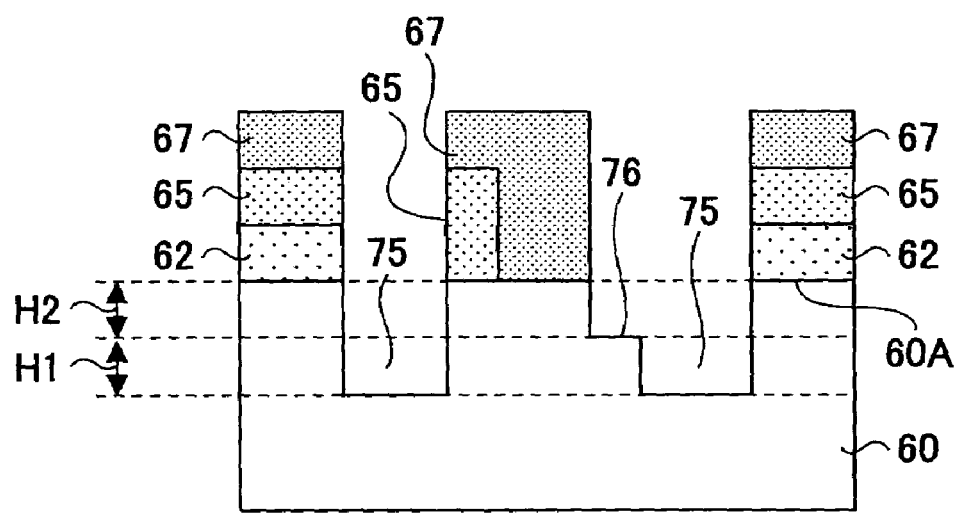
FIG. 21 is a cross-sectional view of a configuration shown in FIG. 19 along line E—E of FIG. 19.

FIG. 19 is a plan view (part 6) showing a process of the manufacture method of the semiconductor inspection device according to the first embodiment of the present invention. FIG. 20 is a cross-sectional view of the configuration shown in FIG. 19 along line C—C of FIG. 19. FIG. 21 is a cross-sectional view of the configuration shown in FIG. 19 along line E—E of FIG. 19. It is to be noted that H2 in FIGS. 20 and 21 indicates an etching depth formed by a second etching process (hereinafter referred to depth H2).

Next, as shown in FIGS. 19 to 21, the second etching process using the third resist layer 67 as a mask is performed on the silicon substrate 60 to form a groove part 75 having a depth (H1+H2) with respect to surface 60A of the silicon substrate 60, and a step part 76 of area 72 corresponding to the fourth column part 49. The step part 75 is formed as a step having a depth H2 with respect to surface 60A of the silicon substrate 60. Then, the third resist film 67 is removed.

Figure 22:
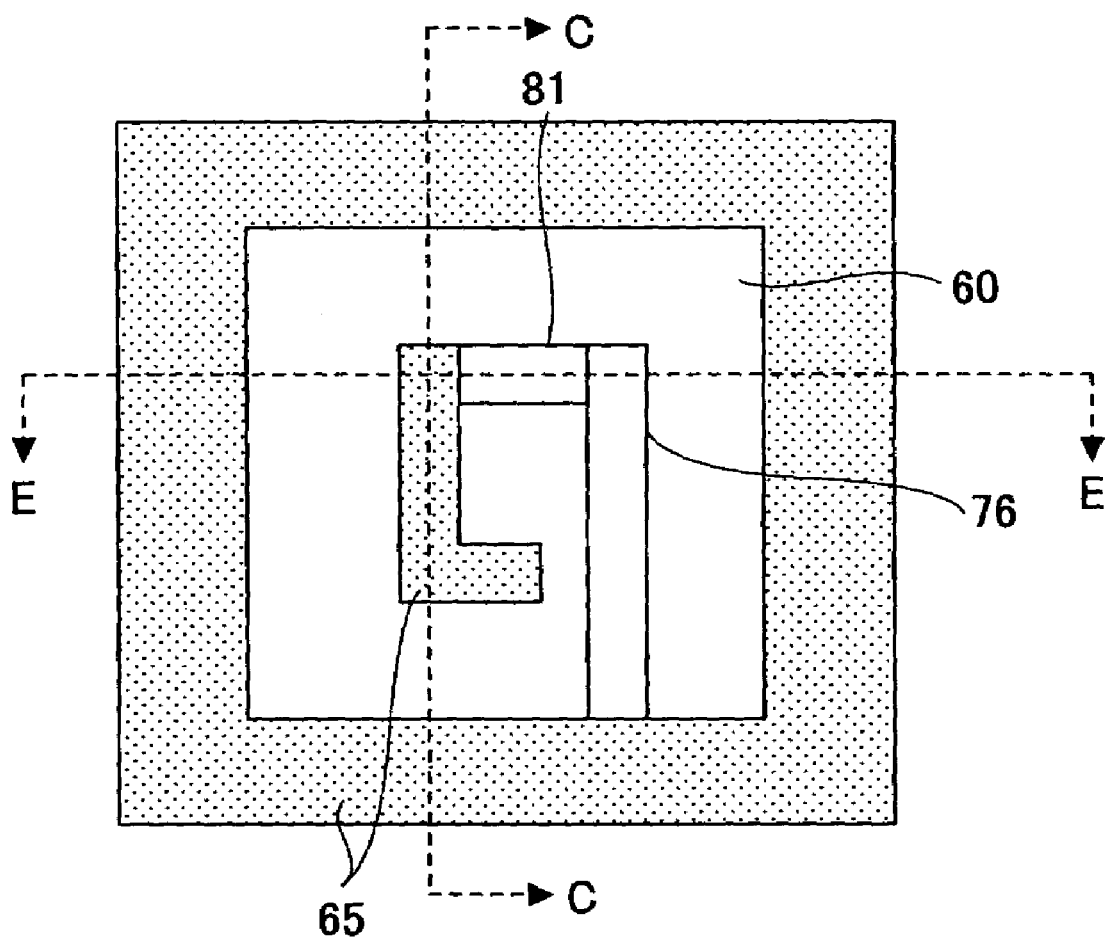
FIG. 22 is a plan view (part 7) showing a process of a manufacture method of a semiconductor inspection device according to a first embodiment of the present invention.
Figure 23:
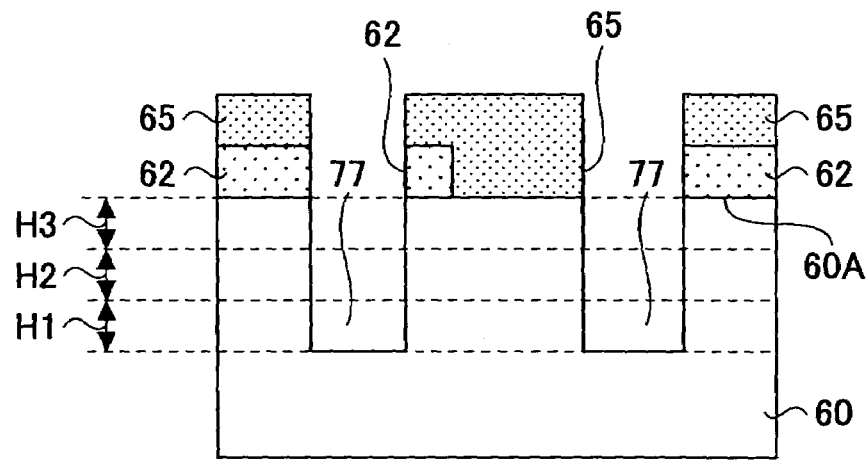
FIG. 23 is a cross-sectional view of a configuration shown in FIG. 22 along line C—C of FIG. 22.
Figure 24:
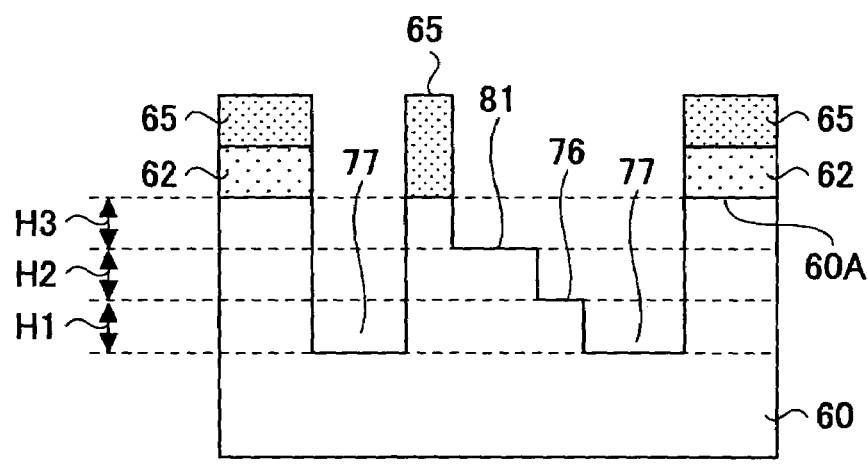
FIG. 24 is a cross-sectional view of a configuration shown in FIG. 22 along line E—E of FIG. 22.

FIG. 22 is a plan view (part 7) showing a process of the manufacture method of the semiconductor inspection device according to the first embodiment of the present invention. FIG. 23 is a cross-sectional view of the configuration shown in FIG. 22 along line C—C of FIG. 22. FIG. 24 is a cross-sectional view of the configuration shown in FIG. 22 along line E—E of FIG. 22. It is to be noted that H3 in FIGS. 23 and 24 indicates an etching amount of a third etching process (etching depth, hereinafter referred to as "depth H3").

Next, as shown in FIGS. 22 to 24, the third etching process using the second resist layer 65 as a mask is performed on the silicon substrate 60 to form a groove part 77 having a depth (H1+H2+H3) with respect to surface 60A of the silicon substrate 60, a step part 79 having a depth (H2+H3) in the area 72 corresponding to the fourth column part 49, and a step part 81 having a depth H3 in the area 66 corresponding to the third column part 48. Then, the second resist film 65 is removed.

Figure 25:
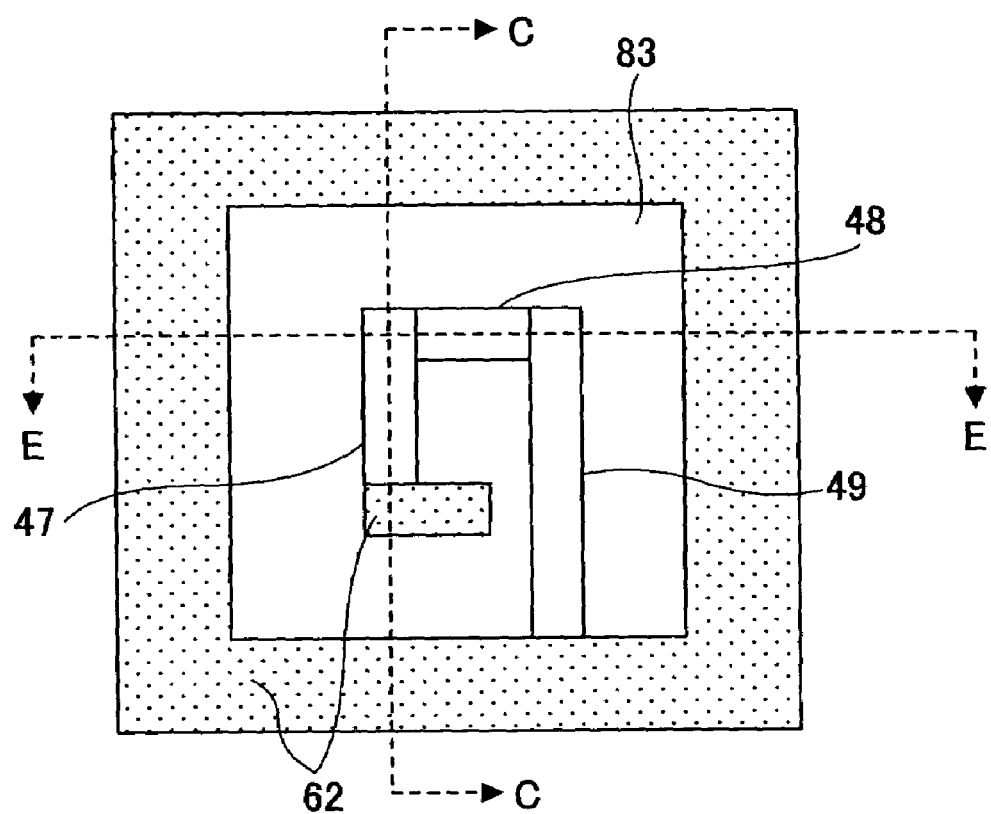
FIG. 25 is a plan view (part 8) showing a process of a manufacture method of a semiconductor inspection device according to a first embodiment of the present invention.
Figure 26:
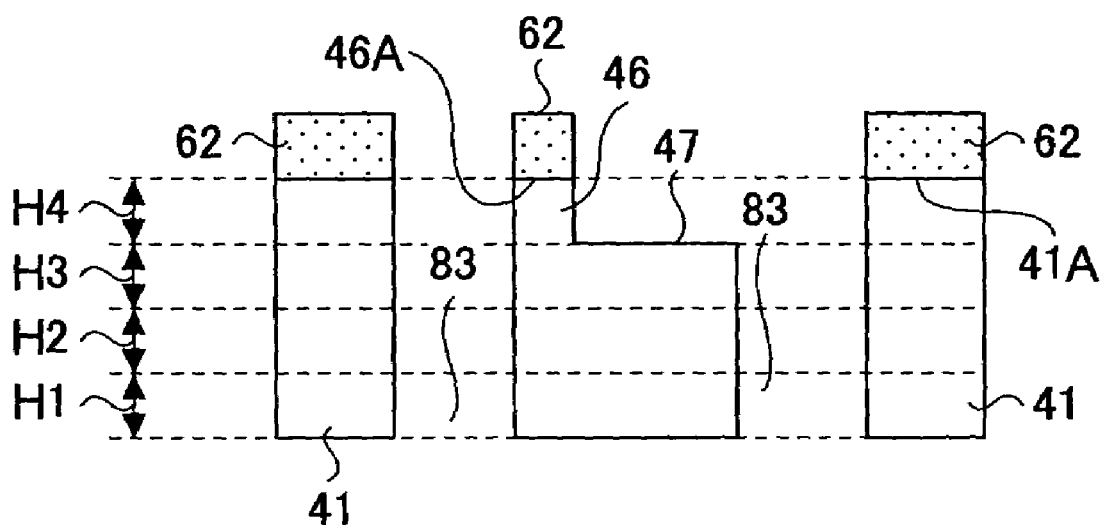
FIG. 26 is a cross-sectional view of a configuration shown in FIG. 25 along line C—C of FIG. 25.
Figure 27:
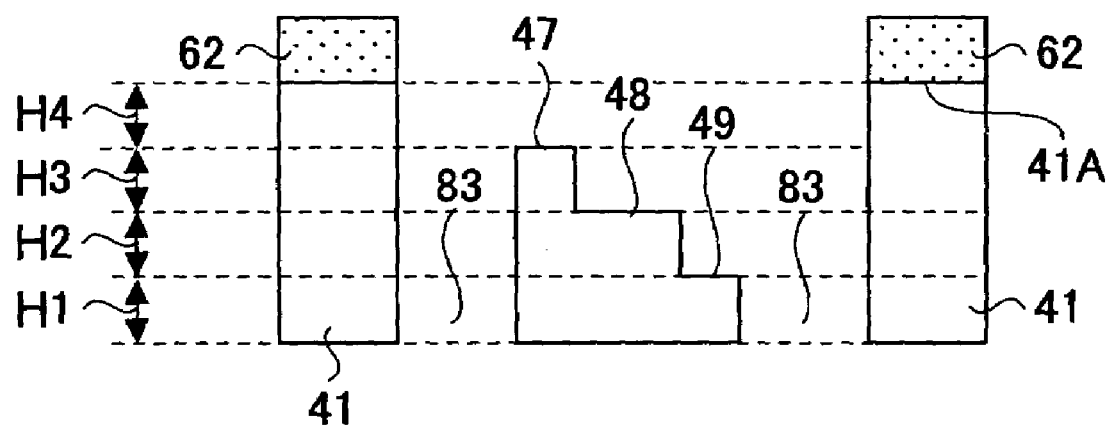
FIG. 27 is a cross-sectional view of a configuration shown in FIG. 25 along line E—E of FIG. 25.

FIG. 25 is a plan view (part 8) showing a process of the manufacture method of the semiconductor inspection device according to the first embodiment of the present invention. FIG. 26 is a cross-sectional view of the configuration shown in FIG. 25 along line C—C of FIG. 25. FIG. 27 is a cross-sectional view of the configuration shown in FIG. 25 along line E—E of FIG. 25. It is to be noted that H4 in FIGS. 26 and 27 indicates an etching amount of a fourth etching process (etching depth, hereinafter referred to as "depth H4").

Next, as shown in FIGS. 25 to 27, the fourth etching process using the first resist layer 62 as a mask is performed on the silicon substrate 60 to form the through part 83, the holding part 41, the fourth column part 49 including a step having a depth (H2+H3+H4) with respect to an upper face 41A of the holding part (silicon holding part) 41 in the area 72, the third column part 48 including a step having a depth (H3+H4) in the area 66, the second column part 47 including a step having a depth (H4) in the area 64, and the first column part 46. An upper face 46A of the first column part 46 is disposed sharing a common plane with the upper face 41A of the holding part 41.

It is to be noted that the depths H1–H4 may be formed satisfying a relation of H1=H2=H3=H4, or may be formed having different depths, respectively. Furthermore, in a case where the depths H1–H4 satisfy the relation of H1=H2=H3=H4, H1 may be set to, for example, 50 µm. Furthermore, the widths of the first-fourth column parts 46–49 may be formed, for example, in sizes ranging approximately between 15–50 µm.

Figure 28:
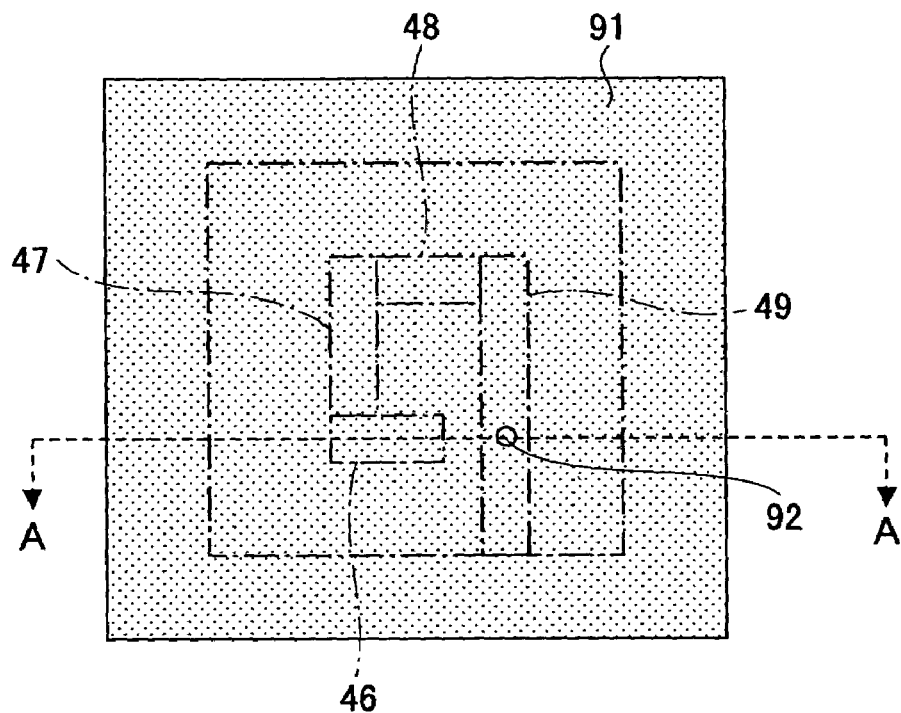
FIG. 28 is a plan view (part 9) showing a process of a manufacture method of a semiconductor inspection device according to a first embodiment of the present invention.
Figure 29:
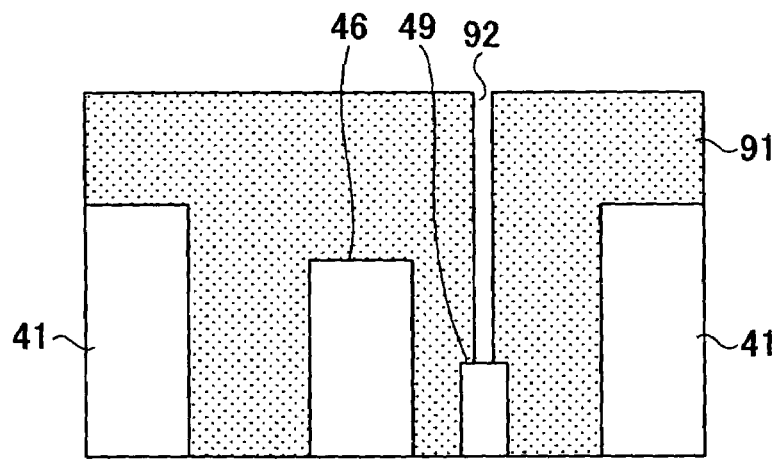
FIG. 29 is a cross-sectional view of a configuration shown in FIG. 28 along line A—A of FIG. 28.
Figure 30:
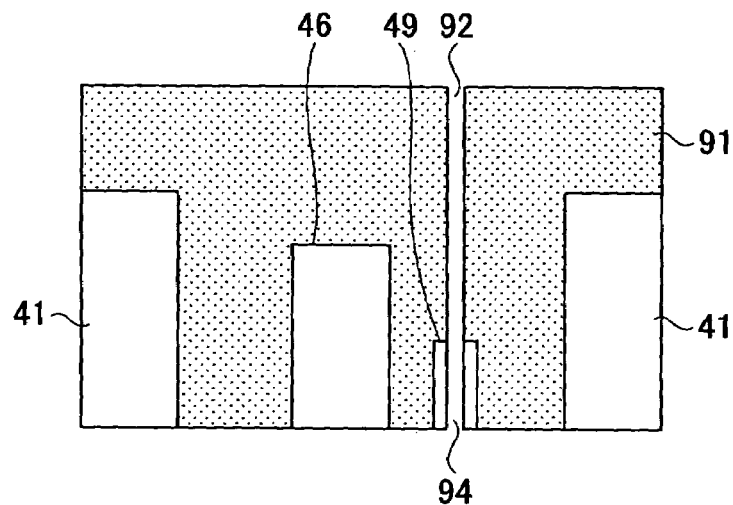
FIG. 30 is a cross-sectional view (part 1) showing a process of the manufacture method of the semiconductor inspection device according to a first embodiment of the present invention.

FIG. 28 is a plan view (part 9) showing a process of the manufacture method of the semiconductor inspection device according to the first embodiment of the present invention. FIG. 29 is a cross-sectional view of the configuration shown in FIG. 28 along line A—A of FIG. 28. FIG. 30 is a cross-sectional view (part 1) showing a process of the manufacture method of the semiconductor inspection device according to the first embodiment of the present invention.

Next, as shown in FIGS. 28 and 29, after the first resist film 62 is removed, a resist film 91 having an opening part 92 for forming a through-hole 94 is formed so that the through-hole electrode 55 can be formed in the fourth column part 49. Then, as shown in FIG. 30, an etching process using the resist film 91 as a mask is performed to form the through-hole 94.

Figure 31:
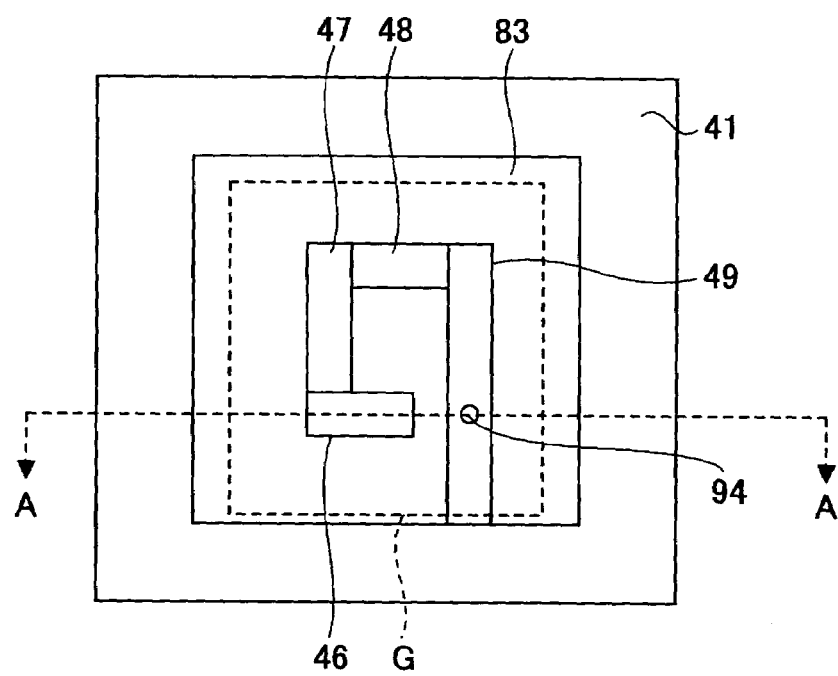
FIG. 31 is a plan view (part 10) showing a process of a manufacture method of a semiconductor inspection device according to a first embodiment of the present invention.
Figure 32:
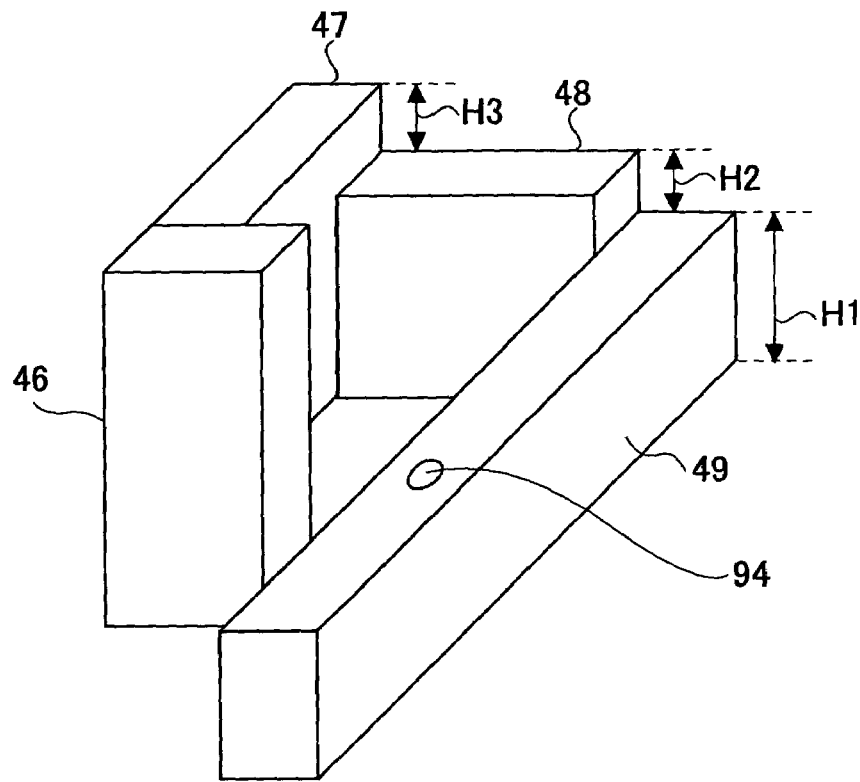
FIG. 32 is a perspective view of first-fourth column parts formed in an area G shown in FIG. 31.
Figure 33:
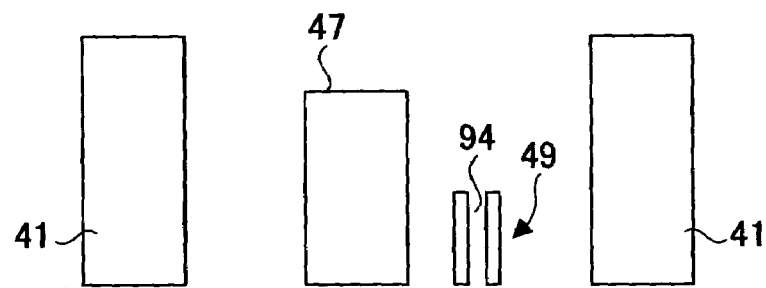
FIG. 33 is a cross-sectional view of a configuration shown in FIG. 31 along line A—A of FIG. 31.

FIG. 31 is a plan view (part 10) showing a process of the manufacture method of the semiconductor inspection device according to the first embodiment of the present invention. FIG. 32 is a perspective view of the first-fourth column parts 46–49 formed in an area G shown in FIG. 31. FIG. 33 is a cross-sectional view of the configuration shown in FIG. 31 along line A—A of FIG. 31. Next, as shown in FIGS. 31 to 33, the resist film 91 is removed.

Figure 34:
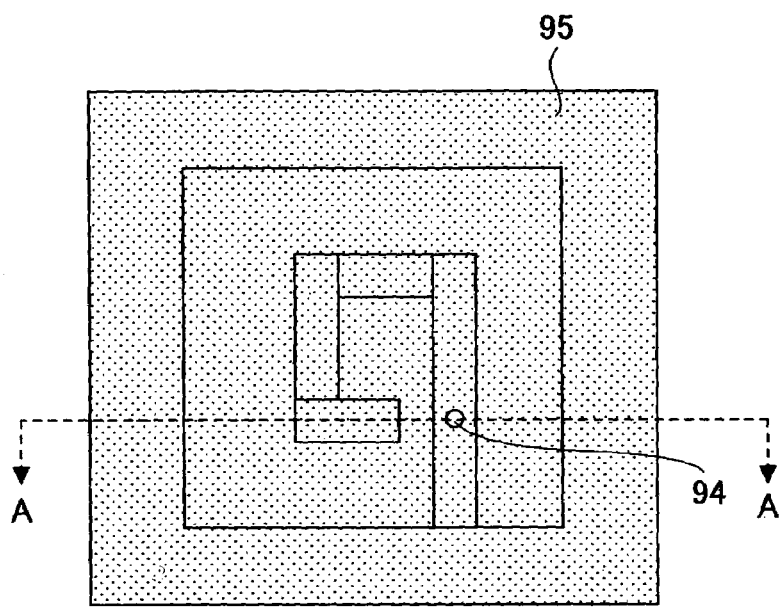
FIG. 34 is a plan view (part 11) showing a process of a manufacture method of a semiconductor inspection device according to a first embodiment of the present invention.
Figure 35:
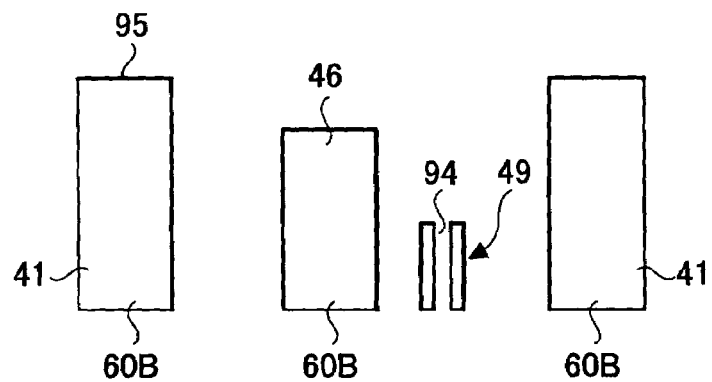
FIG. 35 is a cross-sectional view of a configuration shown in FIG. 34 along line A—A of FIG. 34.

FIG. 34 is a plan view (part 11) showing a process of the manufacture method of the semiconductor inspection device according to the first embodiment of the present invention. FIG. 35 is a cross-sectional view of the configuration shown in FIG. 34 along line A—A of FIG. 34. Next, as shown in FIGS. 34 and 35, a seed layer 95 used when forming a plating film on the configuration shown in FIG. 33 and inside the through-hole 94. The seed layer 95 may be formed with, for example, a sputter method or a CVD method. For example, a Ti film, a W film, or a Cr film may be employed for the seed layer 95.

Figure 36:
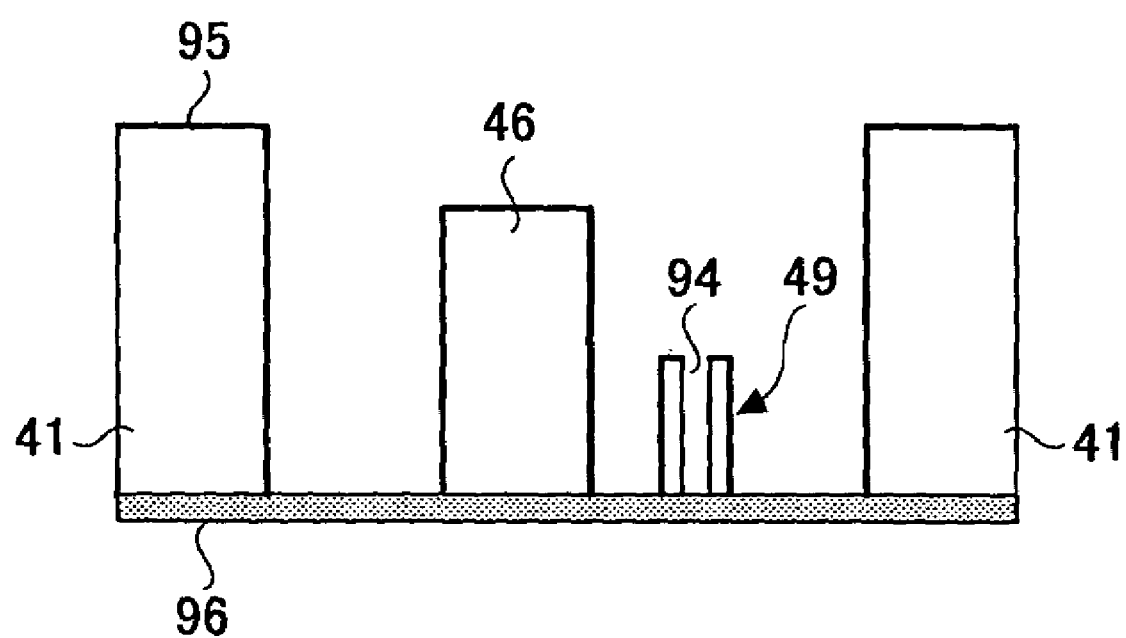
FIG. 36 is a cross-sectional view showing a process of the manufacture method of a semiconductor inspection device according to a first embodiment of the present invention.

FIG. 36 is a cross-sectional view is a cross-sectional view (part 2) showing a process of the manufacture method of the semiconductor inspection device according to the first embodiment of the present invention. Next, as shown in FIG. 36, the seed layer 96 is adhered to the rear face 60B of the contact probe 45 and the holding part 41. For example, a conductive tape having CU as a base material may be employed as the seed layer 96.

Figure 37:
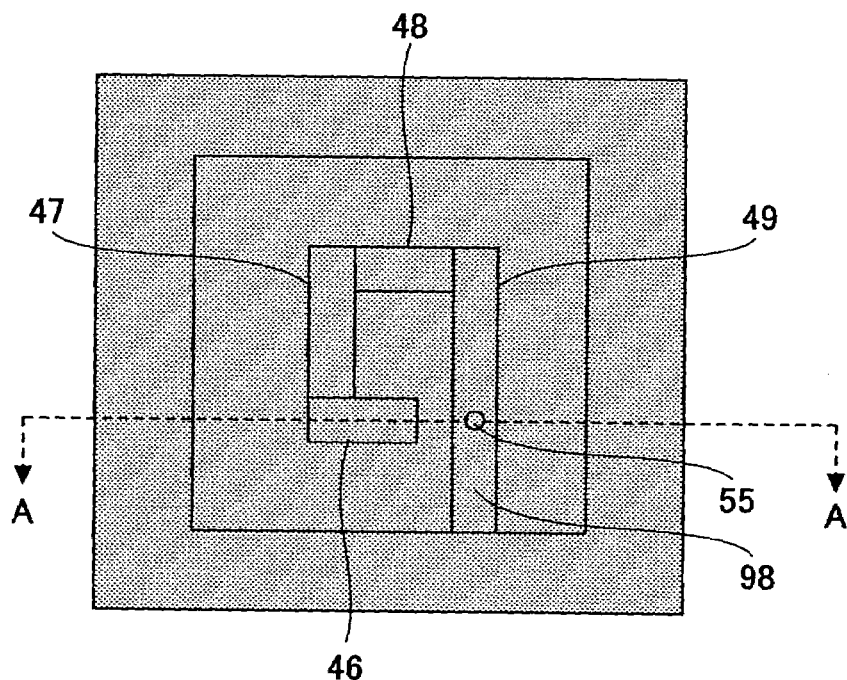
FIG. 37 is a plan view (part 12) showing a process of a manufacture method of a semiconductor inspection device according to a first embodiment of the present invention.
Figure 38:
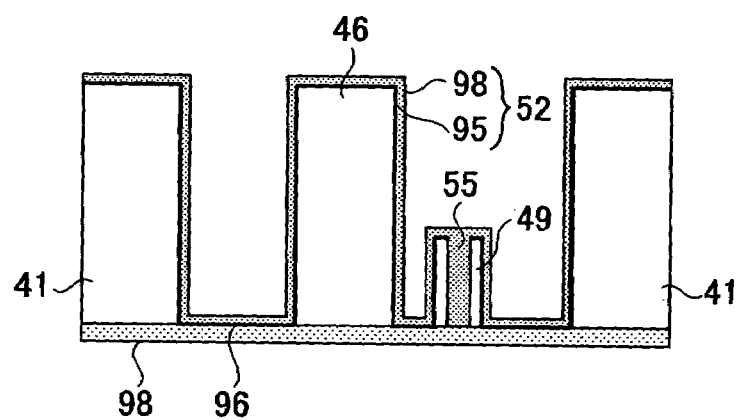
FIG. 38 is a cross-sectional view of a configuration shown in FIG. 37 along line A—A of FIG. 37.

FIG. 37 is a plan view (part 12) showing a process of the manufacture method of the semiconductor inspection device according to the first embodiment of the present invention. FIG. 38 is a cross-sectional view of the configuration shown in FIG. 37 along line A—A of FIG. 37. As shown in FIGS. 37 and 38, electricity is supplied from the seed layer 95 adhered to the rear face 60B of the contact probe 45 and the holding part 41, and then a plating process is performed to form a plating film 98 at the upper and side faces of the first-fourth column parts 46–49. Accordingly, the through-hole electrode 55 including the seed layer 95 and the plating film 98 is formed inside the through-hole 94, and the conductive layer 52 including the seed layer 95 and the plating film 98 is formed on the contact probe 45 and the holding part 41. For example, a film including a Ni alloy, Cu, and/or gold may be employed as the plating film 98.

Figure 39:
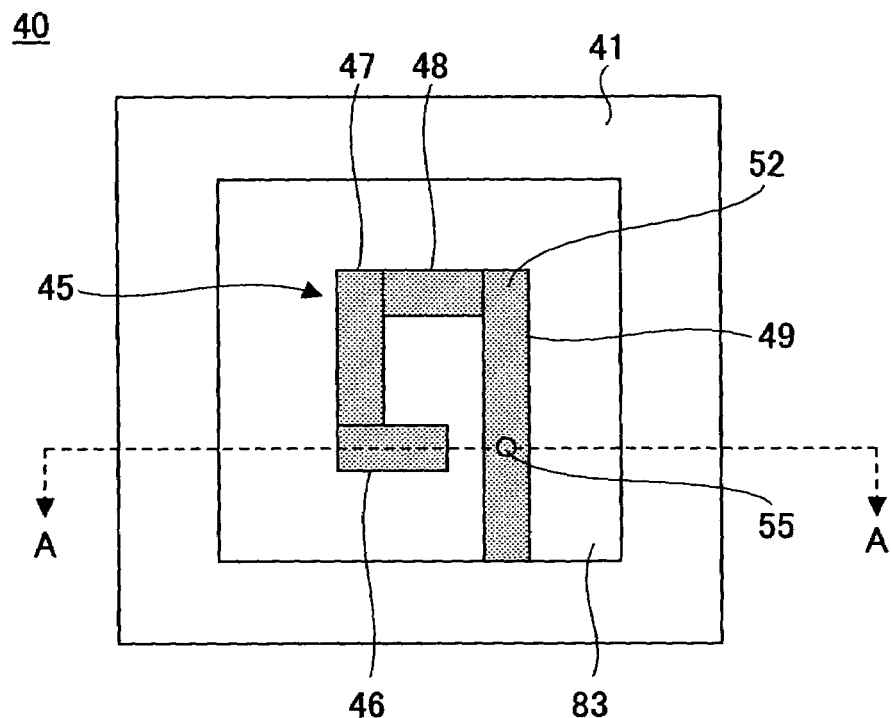
FIG. 39 is a plan view (part 12) showing a process of a manufacture method of a semiconductor inspection device according to a first embodiment of the present invention.
Figure 40:
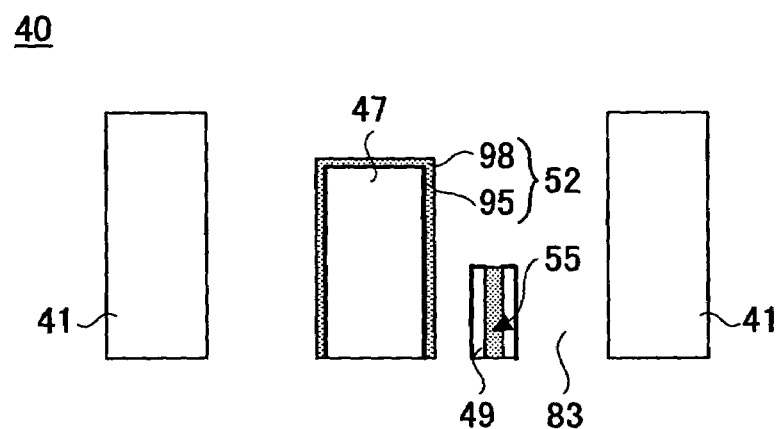
FIG. 40 is a cross-sectional view of a configuration shown in FIG. 39 along line A—A of FIG. 39.

FIG. 39 is a plan view (part 13) showing a process of the manufacture method of the semiconductor inspection device according to the first embodiment of the present invention. FIG. 40 is a cross-sectional view of the configuration shown in FIG. 39 along line A—A of FIG. 39. Next, as shown in FIGS. 39 and 40, the seed layers 95 and 96 and the plating film 98 (conductive layer 52) except for those formed on the surface of the contact probe 45 and the through-hole electrode 55 are removed, thereby completing the manufacturing of the semiconductor inspection device 40 including the contact probe 45 according to the first embodiment of the present invention.

Hence, in manufacturing the semiconductor inspection device 40 with the above-described manufacturing processes, process precision can be improved by employing such photo-etching technique used for processing semiconductor devices or the like, to thereby enable the contact probe(s) 45 to be arranged in a narrower pitch than the conventional contact probe(s). In addition, the contact probe 45 having little plastic deformation can be mass-produced at low cost. It is to be noted that a film of conductive polymer, such as polypyrrole or polyacetylene, may be employed as an alternative for the conductive metal material of the conductive layer 52. The through-hole electrode 55 may be formed with the conductive polymer. Furthermore, in a case of employing polypyrrole as the material of the conductive layer 52, a polypyrrole film can be formed by coating with a polypyrrole solution.

Second Embodiment

Figure 41:
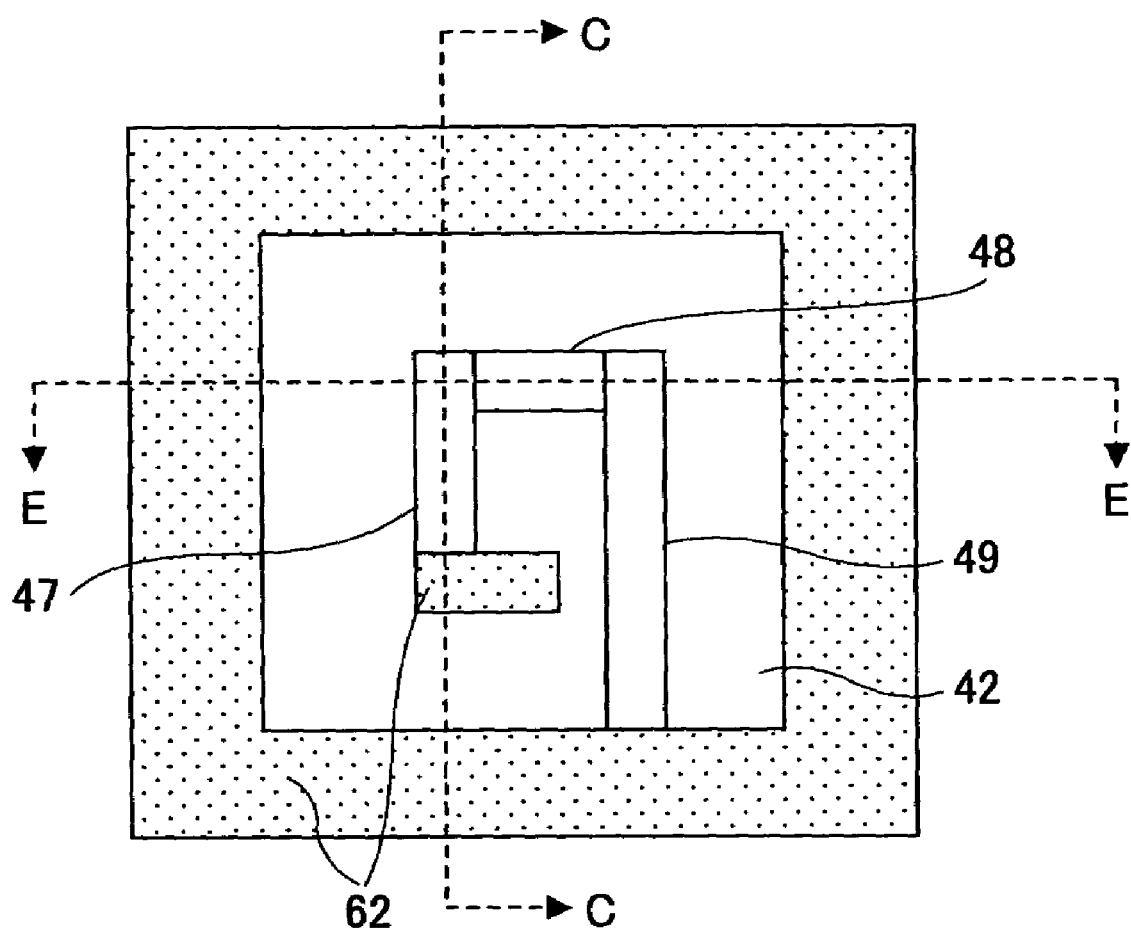
FIG. 41 is a plan view showing a semiconductor inspection device according to a second embodiment of the present invention.
Figure 42:
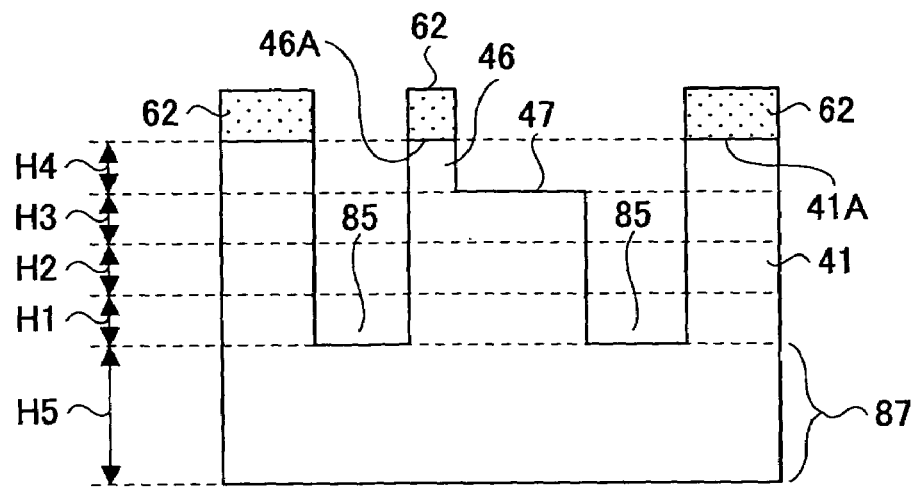
FIG. 42 is a cross-sectional view of a configuration shown in FIG. 41 along line C—C of FIG. 41.
Figure 43:
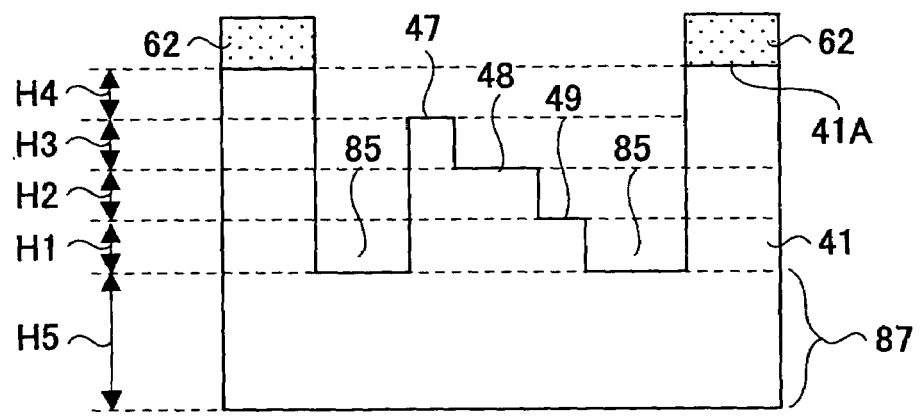
FIG. 43 is a cross-sectional view of a configuration shown in FIG. 41 along line E—E of FIG. 41.

Next, a method of manufacturing a semiconductor inspection device including a contact probe according to a second embodiment of the present invention is described with reference to FIG. 41 to FIG. 43. FIG. 41 is a plan view showing the semiconductor inspection device according to the second embodiment of the present invention, FIG. 42 is a cross-sectional view of the configuration shown in FIG. 41 along line C—C of FIG. 41. FIG. 43 is a cross-sectional view of the configuration shown in FIG. 41 along line E—E of FIG. 41. It is to be noted that the method of manufacturing the semiconductor inspection device including the contact probe according to the second embodiment of the present invention is a modified example of the method of manufacturing the semiconductor inspection device 40 including the contact probe 45 according to the first embodiment of the present invention. Therefore, in FIGS. 41 to 43, like components are denoted by like numerals as of FIGS. 25 to 27.

In the second embodiment of the present invention, by performing the fourth etching process, a plate member 87 having a thickness H5 and the holding part 41 are formed in addition to the formation of the first-fourth column parts 46–49. Furthermore, a groove part 85 is formed between the first-fourth column parts 46–49 and the holding part 41. After the fourth etching process, the plate member 87 is removed by polishing or etching. After the plate member 87 is removed, the conductive layer 52 and the through-hole electrode 55 are formed by executing the above-described processes illustrated with FIGS. 28–40, thereby completing the manufacturing of the semiconductor inspection device 40.

By allowing the plate member 87, which supports the bottom face of the first-fourth column parts 46–49 and the bottom face of the holding part 41, to remain after the fourth etching process, the strength of the semiconductor inspection device 40 can be maintained when the semiconductor inspection device 40 is transported to or from processing apparatuses, such as a photolithography apparatus or an etching apparatus, during the manufacture processes.

Third Embodiment

Figure 44:
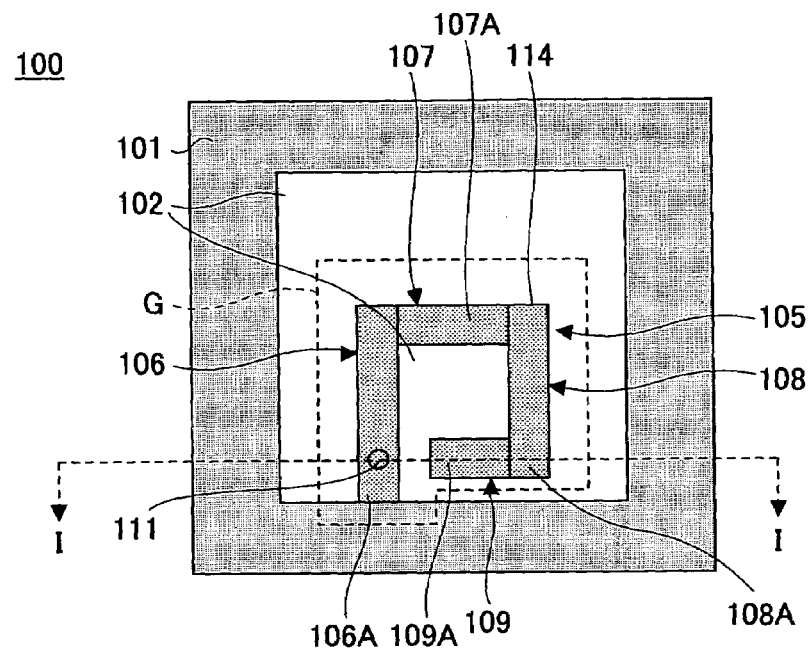
FIG. 44 is a plan view showing a semiconductor inspection device according to a third embodiment of the present invention.
Figure 45:
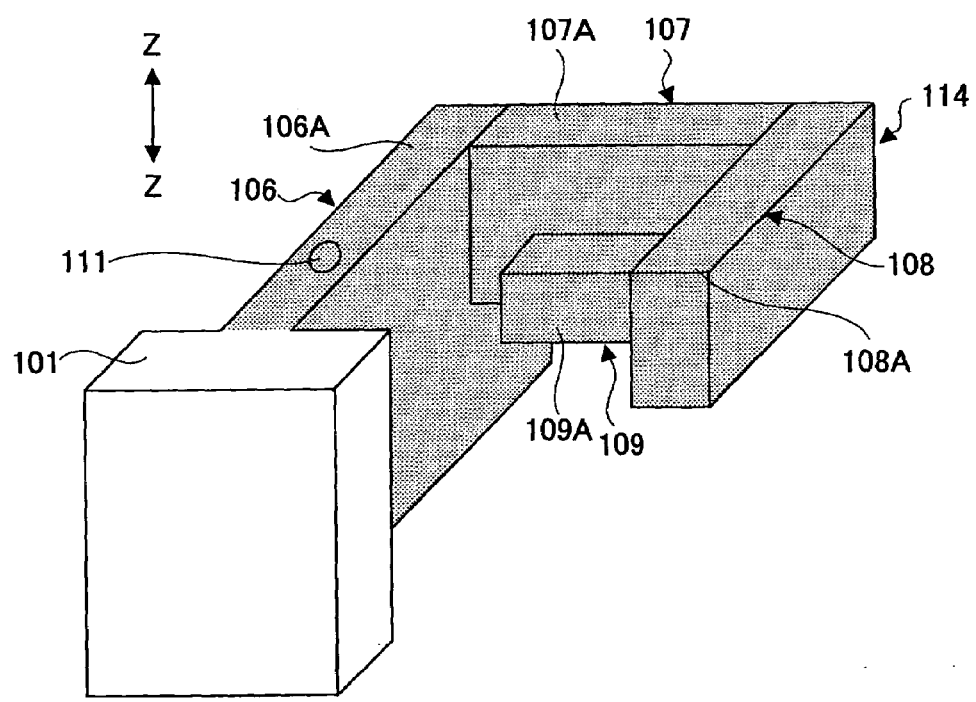
FIG. 45 is a perspective view of a contact probe shown in FIG. 44.
Figure 46:
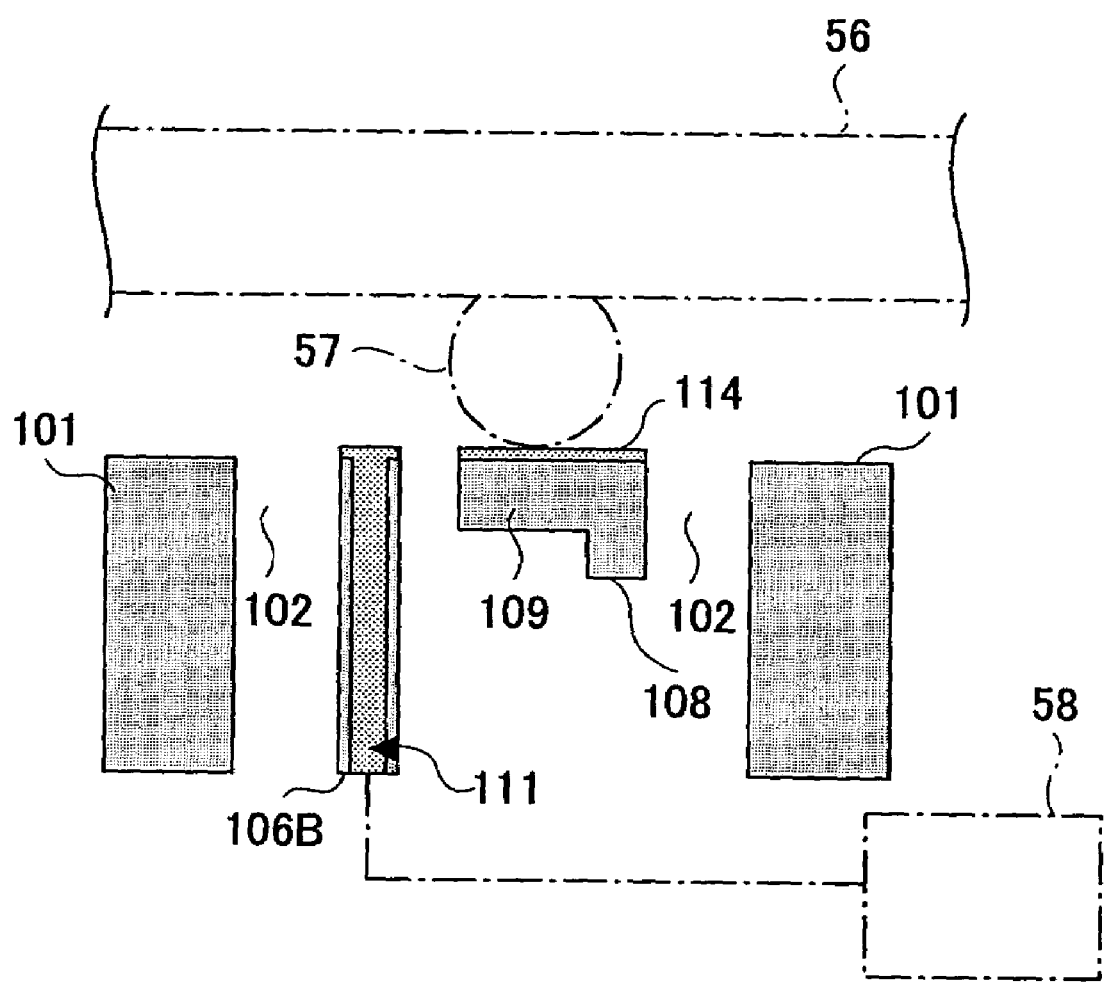
FIG. 46 is a cross-sectional view of a semiconductor inspection device along line I—I of FIG. 44.

Next, a semiconductor inspection device including a contact probe according to a third embodiment of the present invention is described with reference to FIG. 44 to FIG. 46. FIG. 44 is a plan view showing the semiconductor inspection device according to the third embodiment of the present invention, FIG. 45 is a perspective view of a contact probe shown in FIG. 44, and FIG. 46 is a cross-sectional view of the semiconductor inspection device along line I—I of FIG. 44. It is to be noted that the arrow direction Z—Z in FIG. 45 indicates a vertical direction.

A semiconductor inspection device 100 mainly includes a holding part 101, a contact probe 105, and a measuring part 58 (see FIG. 46). The contact probe 105 and the holding part 101 are integrally formed. The holding part 101 is formed as a frame body in a manner encompassing the contact probe 105. The holding part 101 is integrally formed with a first column part 106 included in the contact probe 105. Furthermore, a through part 102 is formed between the contact probe 105 and the holding part 101. This allows the contact probe 105 to be supported by the holding part 101 in a flexible state.

Thus structured, the contact probe 105 is able to attain a spring-like property with respect to the holding part 101. Accordingly, when the contact probe 105 is contacted to the terminal part 57 of the electronic device 56, plastic deformation of the contact probe 105 can be reduced, thereby extending the lifetime of the contact probe 105.

The contact probe 105 includes plural column parts (first column part 106 to fourth column part 109), a conductive layer (conductive metal layer) 114, and a through-hole electrode 111. The first-fourth column parts 106–109, having different height, are disposed in continuation, in which the first column part 106 is the most highest column part, the second column part 107 is the second highest column part, the third column part 108 is the third highest column part, and the fourth column part 109 is the fourth highest column part. In a plan view of the first-fourth column parts 106–109 (See FIG. 44), the first-fourth column parts 106–109 are arranged forming a spiral-like shape. Furthermore, the first-fourth column parts 106–109 each have bottom face parts 106A–109A which share a same plane.

The bottom face parts 106A–109A of the first-fourth column parts 106–109 are respectively formed with the conductive metal layer 114 for electrically connecting with the terminal part 57 of the electronic device 56. By disposing the bottom face parts 106A–109A of the first-fourth column parts 106–109 on a same plane, a large area can be obtained for electrically connecting with the terminal part 57 of the electronic device 56. Accordingly, the contact probe 105 and the electronic device 56 can be electrically connected with satisfactory precision.

The first column part 106 includes the through-hole electrode 111 being formed in a through-hole penetrating the first column part 106 in direction Z—Z. The through-hole electrode 111 serves to electrically connect a surface part of the first column part 106 and the conductive layer 114. The through-hole electrode 111 is formed simultaneously with the forming of the conductive layer 114. The measuring part 58 is electrically connected to the through-hole electrode 111. The measuring part 58 is used in inspecting the electronic device 56 based on input-output signals from the electronic device 56.

The inspection of the electronic device 56 is performed by abutting the terminal part 57 of the electronic device 56 to a face of the fourth column part at which the conductive layer 114 is formed and electrically connecting the measuring part 58 and the electronic device 56 via the through-hole electrode 111.

Accordingly, the contact probe(s) 105 can be disposed in a narrow pitch and be mass produced at low cost.

Figure 47:
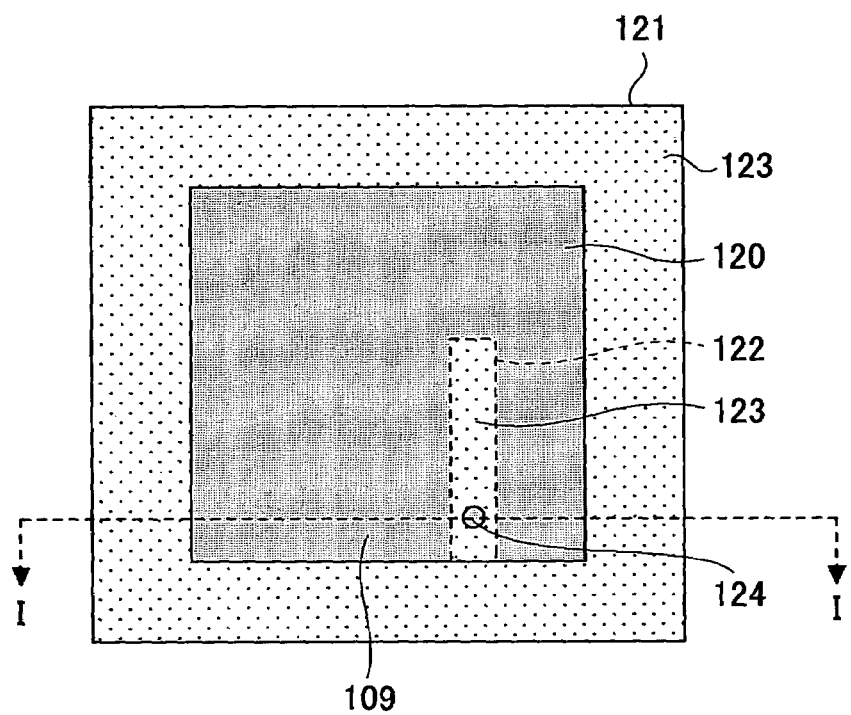
FIG. 47 is a plan view (part 1) showing a process of the manufacture method of a semiconductor inspection device according to a third embodiment of the present invention.
Figure 48:
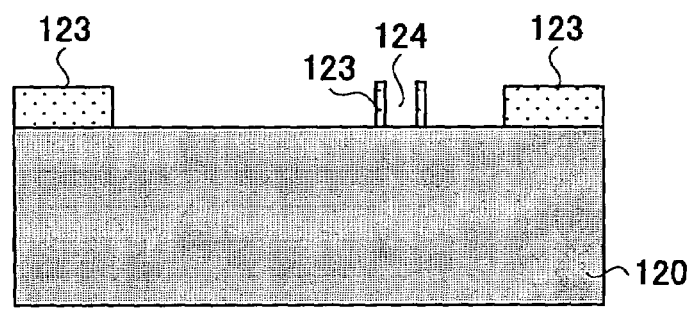
FIG. 48 is a cross-sectional view of a configuration shown in FIG. 47 along line I—I of FIG. 47.

Next, a method of manufacturing the semiconductor inspection device 100 including the contact probe 105 according to the third embodiment of the present invention is described with reference to FIGS. 47–72. FIG. 47 is a plan view (part 1) showing a process of the manufacture method of the semiconductor inspection device according to the third embodiment of the present invention. FIG. 48 is a cross-sectional view of the configuration shown in FIG. 47 along line I—I of FIG. 47.

As shown in FIGS. 47 and 48, a first resist film 123 is formed on an area 121 of the silicon substrate 120 corresponding to the holding part 101 and on an area 122 of the silicon substrate 120 corresponding to the first column part 106. Here, a opening part 124 is formed in the first resist film 123 disposed in the area 122 corresponding to the first column part 106. The opening part 124 is provided for forming a through-hole afterwards in the first column part 106. It is to be noted that, as a preferable example of the first resist film 123, a liquid resist containing, for example, a phenolic resin as a main component, a melamine and/or epoxy resin as a sub-component, and a photosensitive agent may be employed, in which the resist is coated and is then heated.

Figure 49:
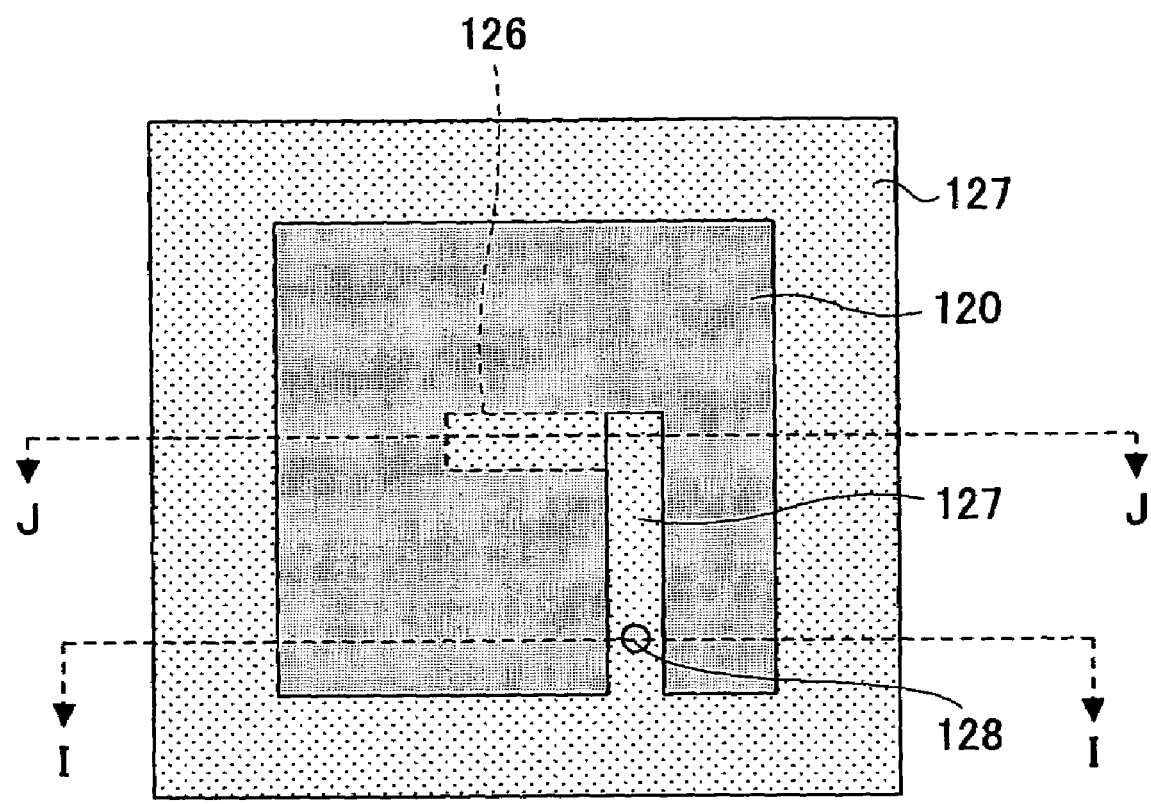
FIG. 49 is a plan view (part 2) showing a process of the manufacture method of a semiconductor inspection device according to a third embodiment of the present invention.
Figure 50:
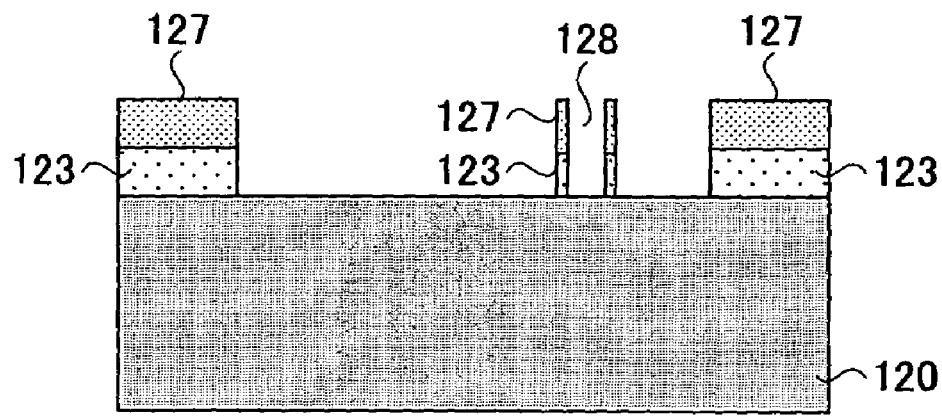
FIG. 50 is a cross-sectional view of a configuration shown in FIG. 49 along line I—I of FIG. 49.
Figure 51:
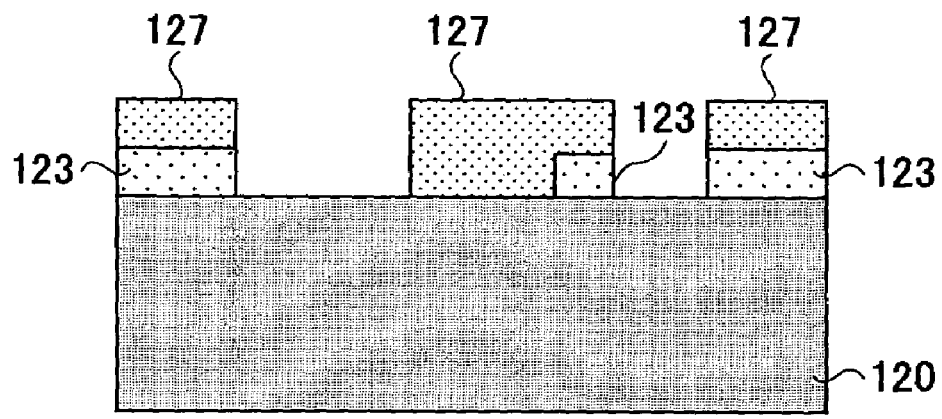
FIG. 51 is a cross-sectional view of a configuration shown in FIG. 49 along line J—J of FIG. 49.

FIG. 49 is a plan view (part 2) showing a process of the manufacture method of the semiconductor inspection device according to the third embodiment of the present invention. FIG. 50 is a cross-sectional view of the configuration shown in FIG. 49 along line I—I of FIG. 49. FIG. 51 is a cross-sectional view of the configuration shown in FIG. 49 along line J—J of FIG. 49.

Next, as shown in FIGS. 49 to 51, a second resist film 107, having a property different from that of the first resist film 123 and thus having an opening part 128 formed thereto, is formed on an area 126 of the silicon substrate 120 corresponding to the second column part 107 and on the first resist film 123. As a preferable example of the second resist film 127, a liquid resist containing, for example, a novolac resin and/or naphthoquinone diazide dielectric as a main component may be employed.

Figure 52:
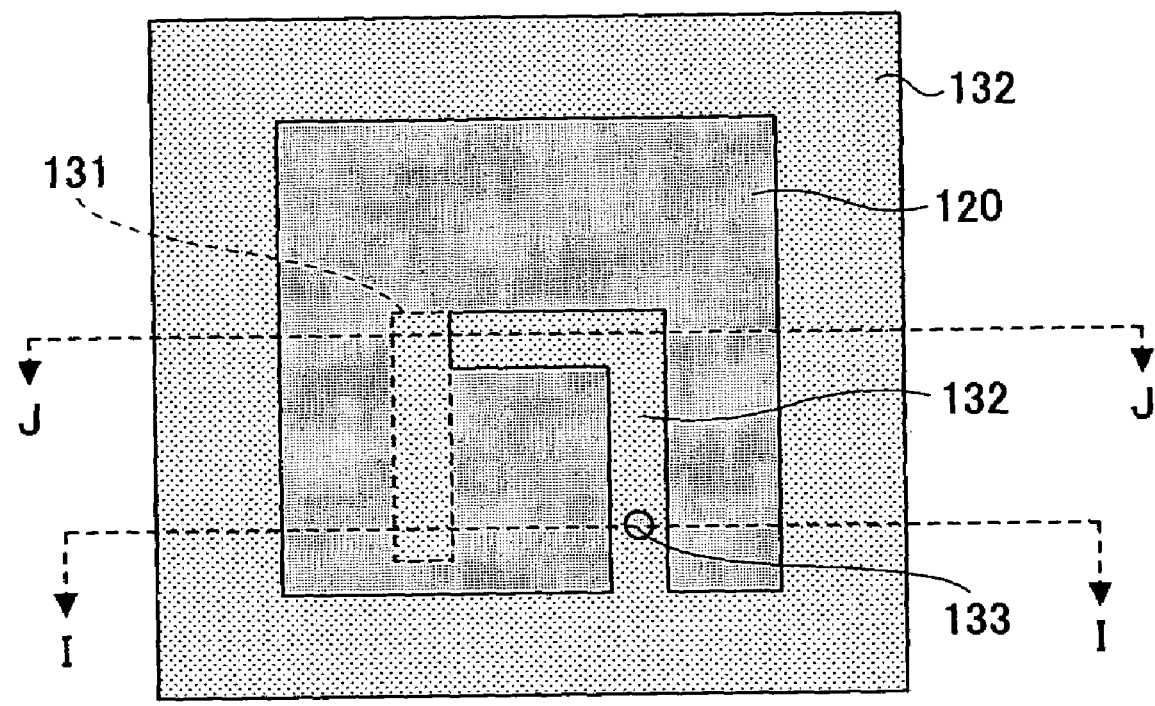
FIG. 52 is a plan view (part 3) showing a process of the manufacture method of a semiconductor inspection device according to a third embodiment of the present invention.
Figure 53:
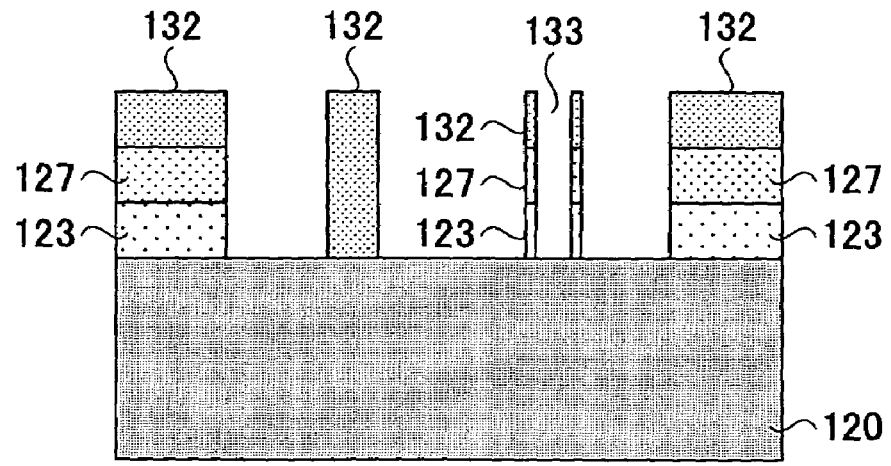
FIG. 53 is a cross-sectional view of a configuration shown in FIG. 52 along line I—I of FIG. 52.
Figure 54:
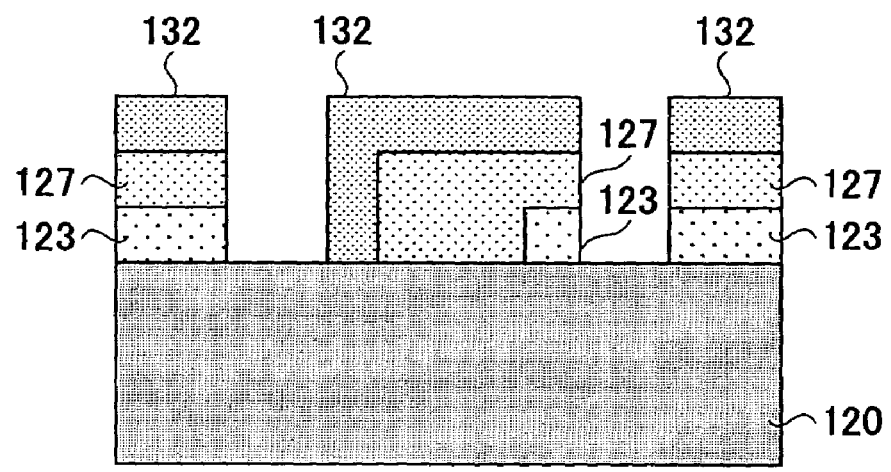
FIG. 54 is a cross-sectional view of a configuration shown in FIG. 52 along line J—J of FIG. 52.

FIG. 52 is a plan view (part 3) showing a process of the manufacture method of the semiconductor inspection device according to the third embodiment of the present invention. FIG. 53 is a cross-sectional view of the configuration shown in FIG. 52 along line I—I of FIG. 52. FIG. 54 is a cross-sectional view of the configuration shown in FIG. 52 along line J—J of FIG. 52.

Next, as shown in FIGS. 52 to 54, a third resist film 108, having a property different from that of the second resist film 127, is formed on an area 131 of the silicon substrate 120 corresponding to the third column part 108 and on the second resist film 127. The third resist film 132 is formed with an opening part 133 which exposes the opening part 128. As a preferable example of the third resist film 132, a liquid resist containing, for example, a phenolic resin as a main component, a melamine and/or epoxy resin as a sub-component, and a photosensitive agent may be employed, in which the resist is coated and is then heated.

Figure 55:
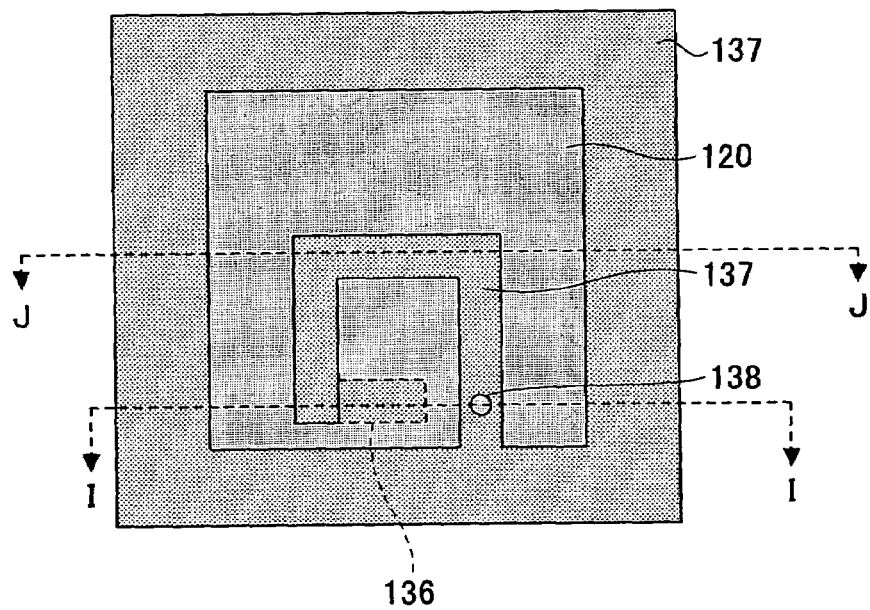
FIG. 55 is a plan view (part 4) showing a process of the manufacture method of a semiconductor inspection device according to a third embodiment of the present invention.
Figure 56:
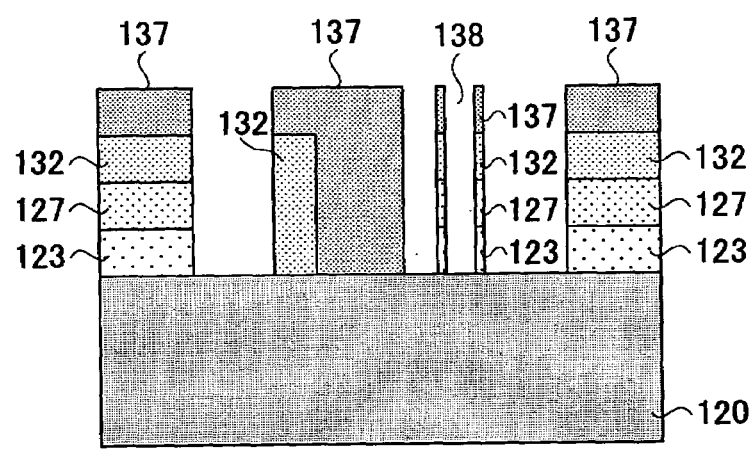
FIG. 56 is a cross-sectional view of a configuration shown in FIG. 55 along line I—I of FIG. 55.
Figure 57:
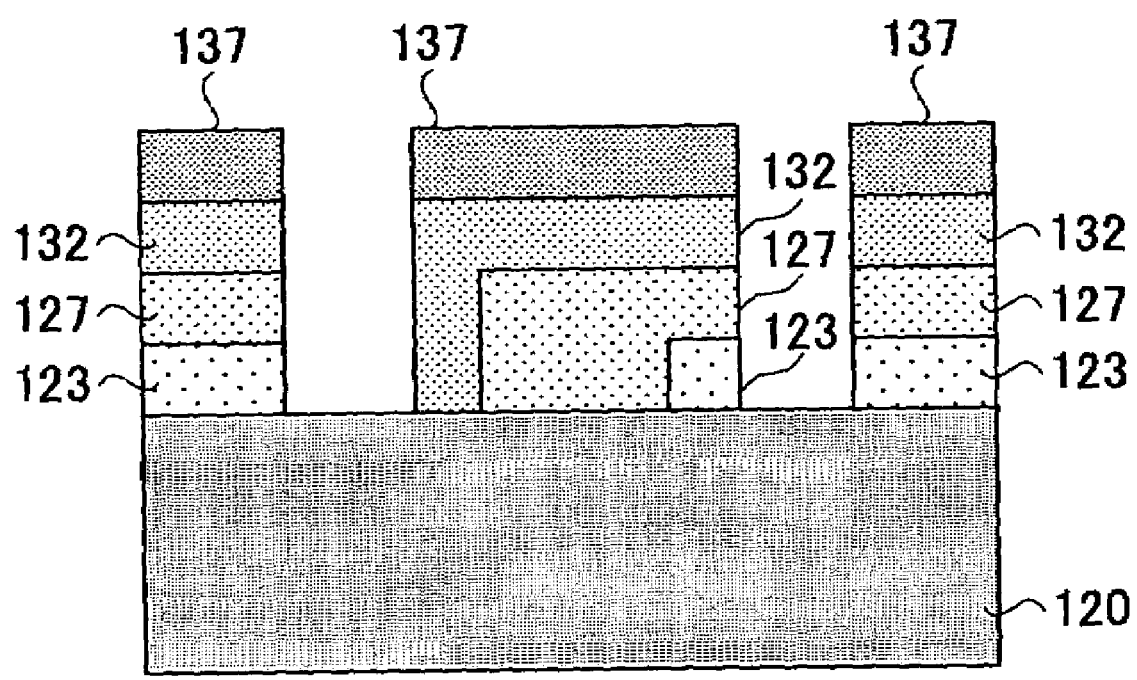
FIG. 57 is a cross-sectional view of a configuration shown in FIG. 55 along line J—J of FIG. 55.

FIG. 55 is a plan view (part 4) showing a process of the manufacture method of the semiconductor inspection device according to the third embodiment of the present invention. FIG. 56 is a cross-sectional view of the configuration shown in FIG. 55 along line I—I of FIG. 55. FIG. 57 is a cross-sectional view of the configuration shown in FIG. 55 along line J—J of FIG. 55.

Next, as shown in FIGS. 55 to 57, a fourth resist film 109, having a property different from that of the third resist film 132, is formed on an area 136 of the silicon substrate 120 corresponding to the fourth column part 109 and on the third resist film 132. The fourth resist film 137 is formed with an opening part 138 which exposes the opening part 133. As a preferable example of the fourth resist film 137, a liquid resist containing, for example, a novolac resin and/or naphthoquinone diazide dielectric as a main component may be employed.

Figure 58:
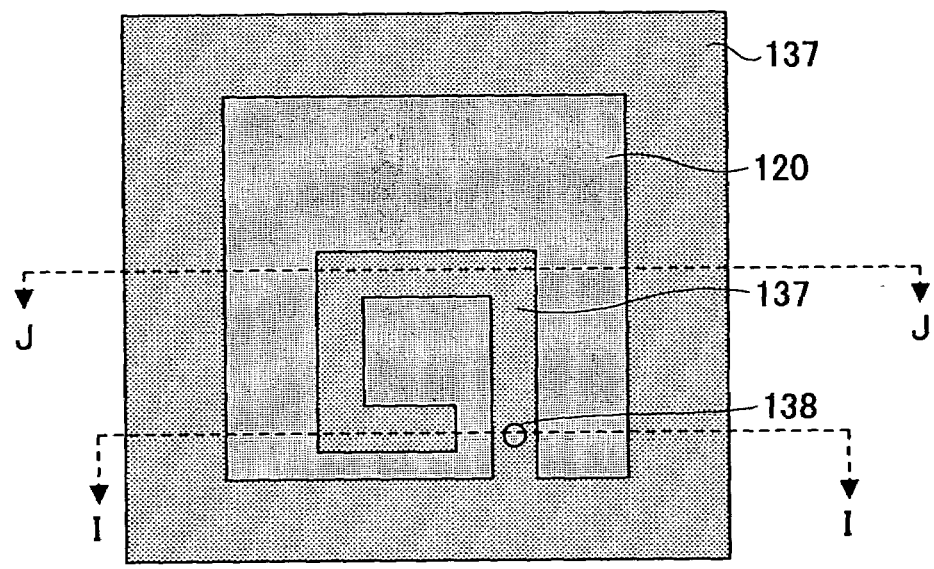
FIG. 58 is a plan view (part 5) showing a process of the manufacture method of a semiconductor inspection device according to a third embodiment of the present invention.
Figure 59:
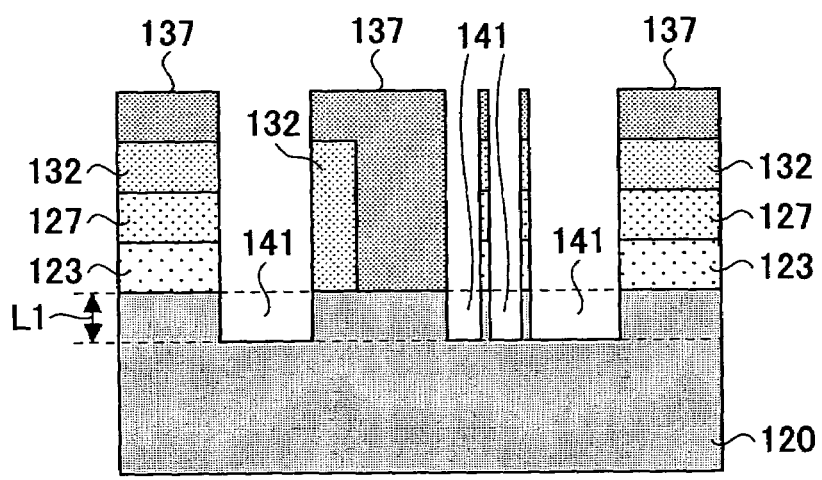
FIG. 59 is a cross-sectional view of a configuration shown in FIG. 58 along line I—I of FIG. 58.
Figure 60:
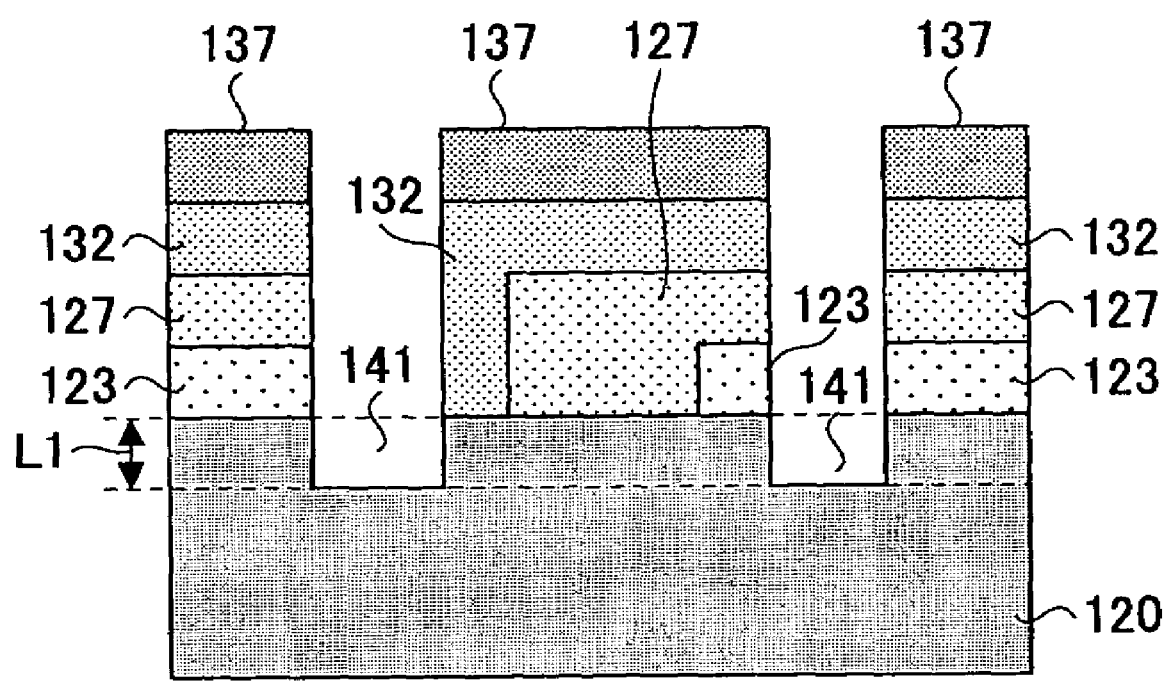
FIG. 60 is a cross-sectional view of a configuration shown in FIG. 58 along line J—J of FIG. 58.

FIG. 58 is a plan view (part 5) showing a process of the manufacture method of the semiconductor inspection device according to the third embodiment of the present invention. FIG. 59 is a cross-sectional view of the configuration shown in FIG. 58 along line I—I of FIG. 58. FIG. 60 is a cross-sectional view of the configuration shown in FIG. 58 along line J—J of FIG. 58. It is to be noted that L1 in FIGS. 58 to 60 indicates the depth of a groove part 141 formed by a first etching process (etching depth, hereinafter referred to as depth L1).

Next, as shown in FIGS. 58 to 60, the first etching process using the fourth resist layer 137 as a mask is performed on the silicon substrate 120 to form the groove part 141 having a depth L1 with respect to the surface of the silicon substrate 120. Then, the fourth resist film 137 is removed.

Figure 61:
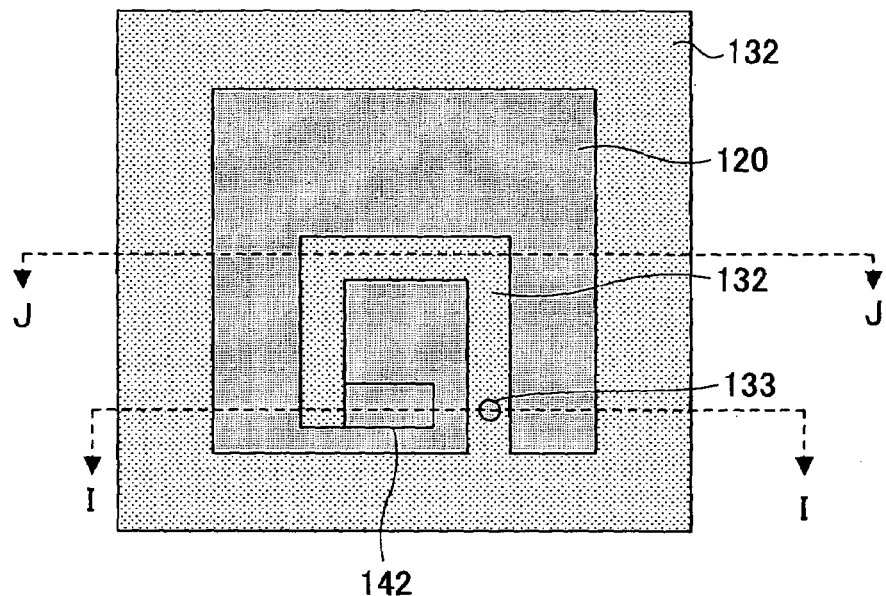
FIG. 61 is a plan view (part 6) showing a process of the manufacture method of a semiconductor inspection device according to a third embodiment of the present invention.
Figure 62:
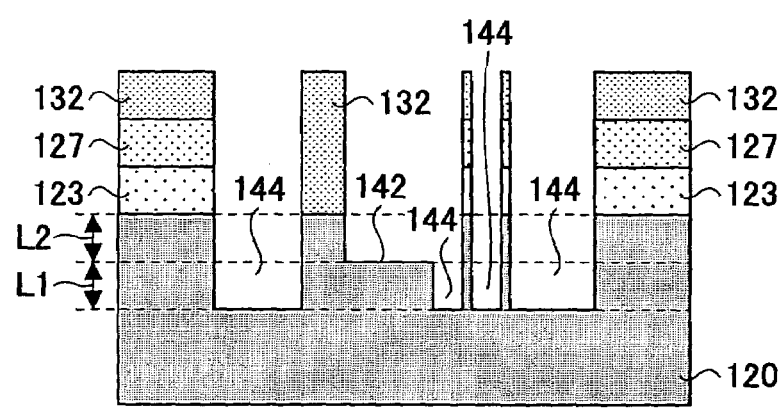
FIG. 62 is a cross-sectional view of a configuration shown in FIG. 61 along line I—I of FIG. 61.
Figure 63:
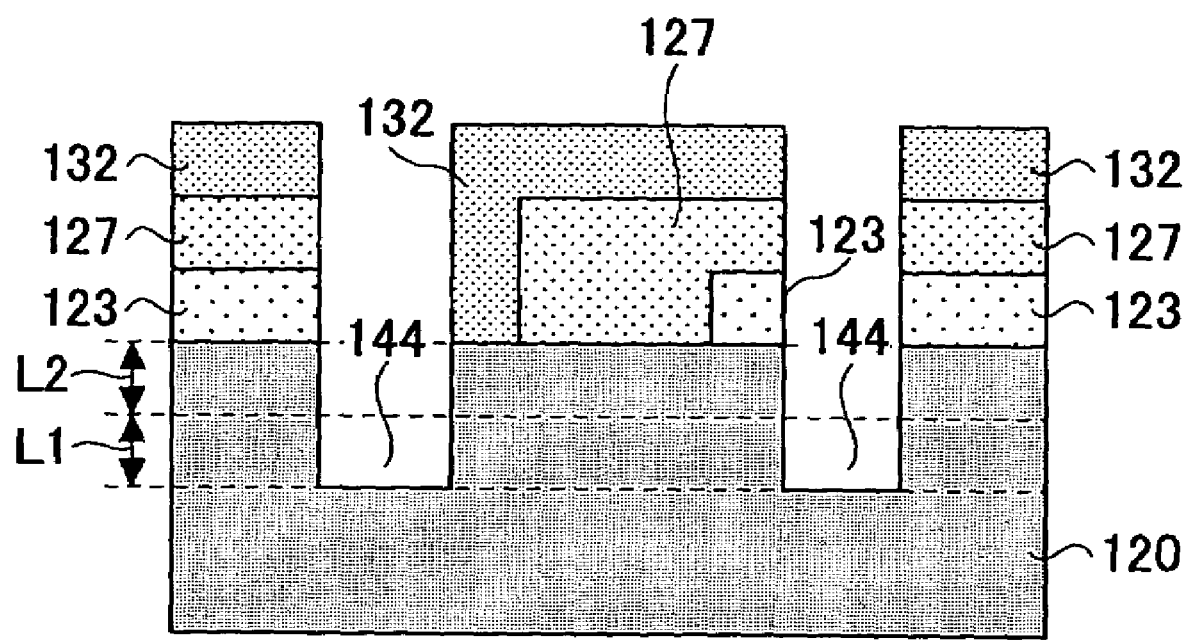
FIG. 63 is a cross-sectional view of a configuration shown in FIG. 61 along line J—J of FIG. 61.

FIG. 61 is a plan view (part 6) showing a process of the manufacture method of the semiconductor inspection device according to the third embodiment of the present invention. FIG. 62 is a cross-sectional view of the configuration shown in FIG. 61 along line I—I of FIG. 61. FIG. 63 is a cross-sectional view of the configuration shown in FIG. 61 along line J—J of FIG. 61. It is to be noted that L2 in FIGS. 61 to 63 indicates an etching amount depth formed by a second etching process (etching depth, hereinafter referred to as depth L2).

Figure 64:
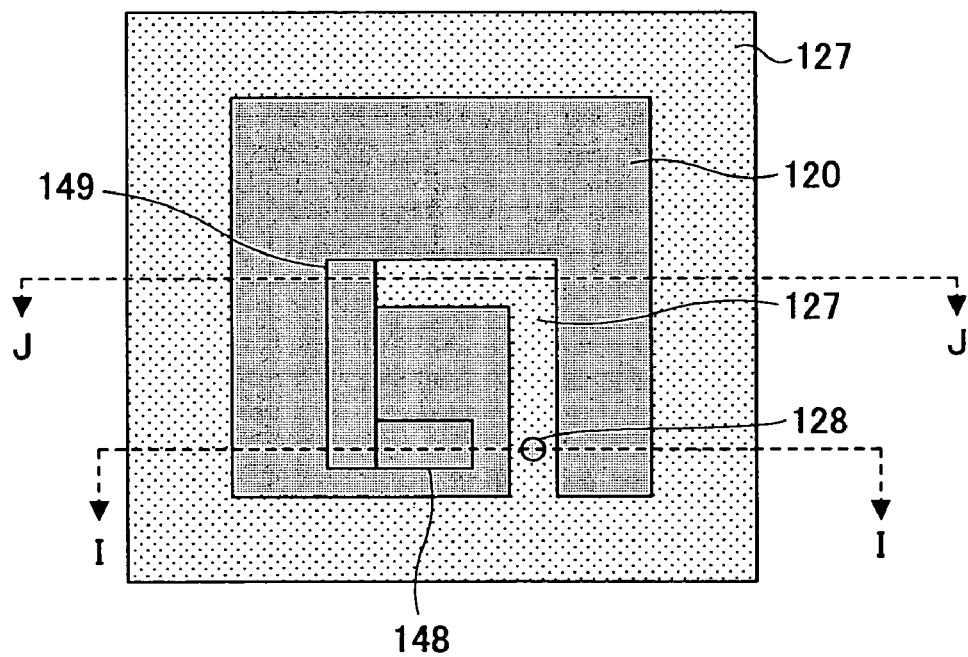
FIG. 64 is a plan view (part 7) showing a process of the manufacture method of a semiconductor inspection device according to a third embodiment of the present invention.
Figure 65:
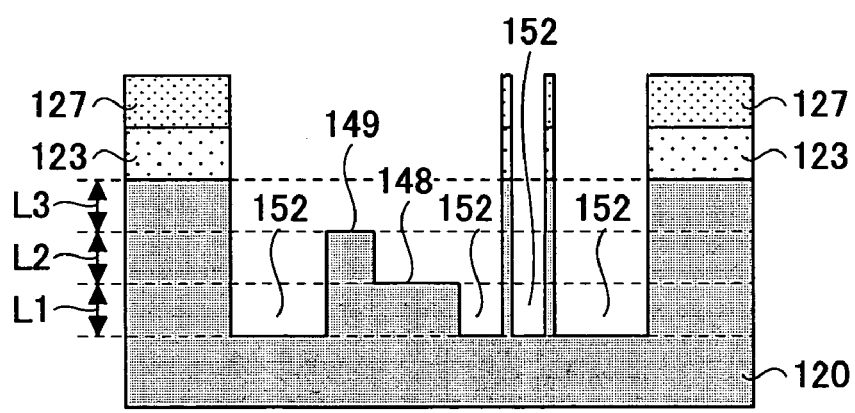
FIG. 65 is a cross-sectional view of a configuration shown in FIG. 64 along line I—I of FIG. 64.
Figure 66:
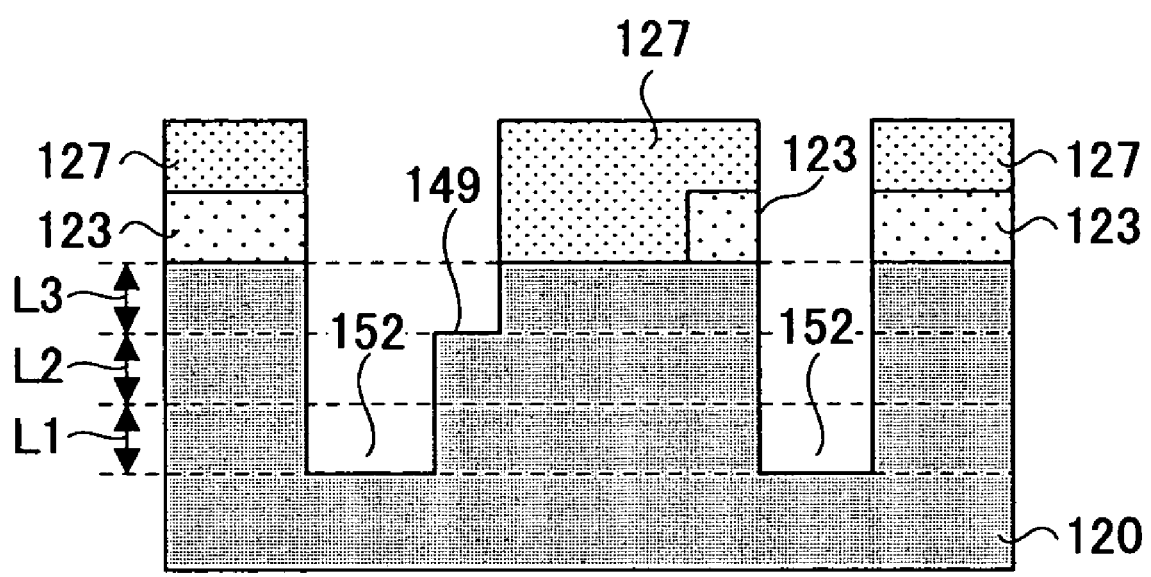
FIG. 66 is a cross-sectional view of a configuration shown in FIG. 64 along line J—J of FIG. 64.

Next, as shown in FIGS. 64 to 66, the second etching process using the third resist layer 132 as a mask is performed on the silicon substrate 120 to form a groove part 146 having a depth (L1+L2) with respect to the surface of the silicon substrate 120, and a step part 142 of area 136 corresponding to the fourth column part 109. The step part 142 is formed as a step having a depth L2 with respect to the surface of the silicon substrate 120. Then, the third resist film 132 is removed.

FIG. 64 is a plan view (part 7) showing a process of the manufacture method of the semiconductor inspection device according to the third embodiment of the present invention. FIG. 65 is a cross-sectional view of the configuration shown in FIG. 64 along line I—I of FIG. 64. FIG. 66 is a cross-sectional view of the configuration shown in FIG. 64 along line J—J of FIG. 64. It is to be noted that L3 in FIGS. 64 to 66 indicates an etching amount of a third etching process (etching depth, hereinafter referred to as "depth L3").

Figure 67:
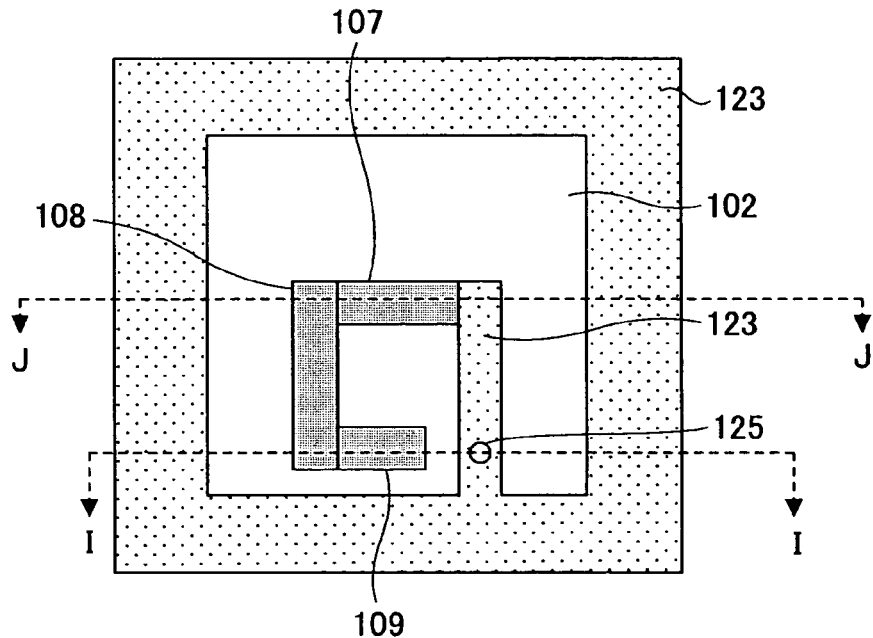
FIG. 67 is a plan view (part 8) showing a process of the manufacture method of a semiconductor inspection device according to a third embodiment of the present invention.
Figure 68:
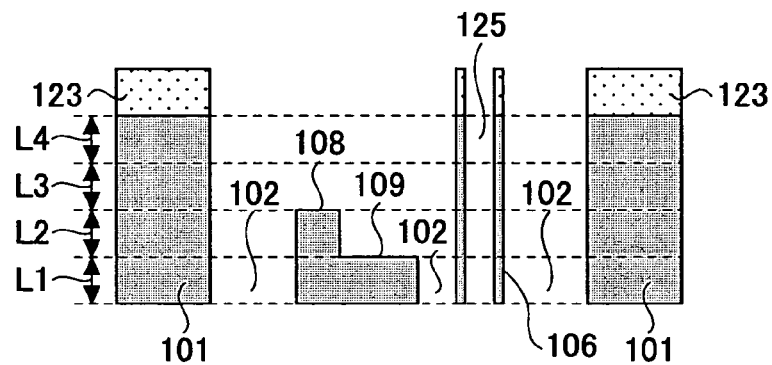
FIG. 68 is a cross-sectional view of a configuration shown in FIG. 67 along line I—I of FIG. 67.
Figure 69:
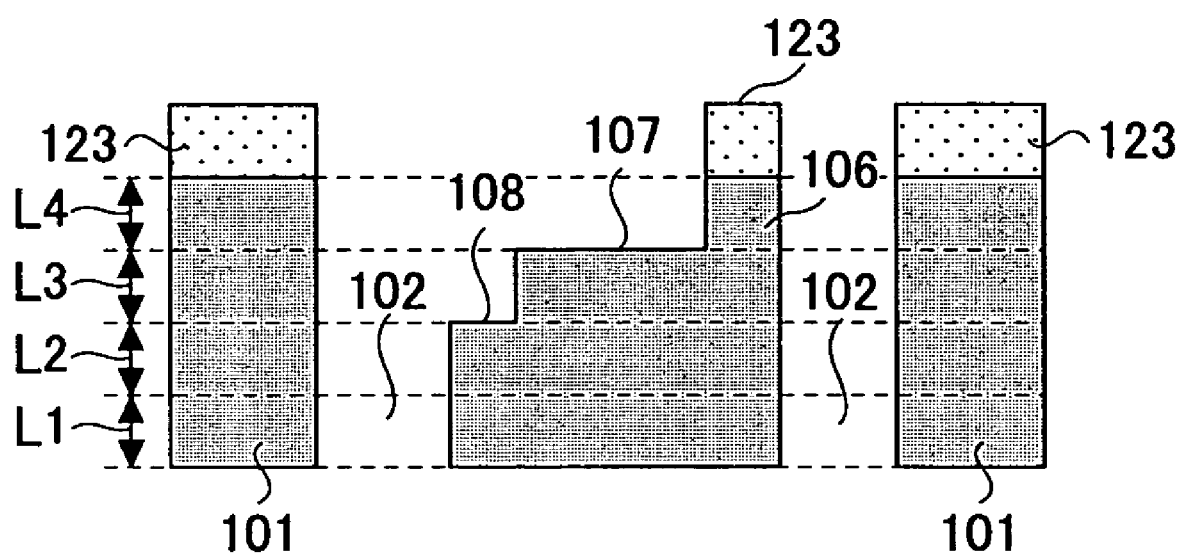
FIG. 69 is a cross-sectional view of a configuration shown in FIG. 67 along line J—J of FIG. 67.

Next, as shown in FIGS. 67 to 69, the third etching process using the second resist layer 127 as a mask is performed on the silicon substrate 120 to form a groove part 152 having a depth (L1+L2+L3) with respect to the surface of the silicon substrate 120, a step part 148 having a depth (L2+L3) in the area 136 corresponding to the fourth column part 109, and a step part 149 having a depth L3 in the area 131 corresponding to the third column part 108. Then, the second resist film 127 is removed.

FIG. 67 is a plan view (part 8) showing a process of the manufacture method of the semiconductor inspection device according to the third embodiment of the present invention. FIG. 68 is a cross-sectional view of the configuration shown in FIG. 67 along line I—I of FIG. 67. FIG. 69 is a cross-sectional view of the configuration shown in FIG. 67 along line J—J of FIG. 67. It is to be noted that L4 in FIGS. 67 to 69 indicates an etching amount of a fourth etching process (etching depth, hereinafter referred to as "depth L4").

Next, as shown in FIGS. 67 to 69, the fourth etching process using the first resist layer 123 as a mask is performed on the silicon substrate 120 to form the through part 102, the holding part 101, the fourth column part 109 including a step having a depth (L2+L3+L4) with respect to an upper face of the holding part 101 in the area 136, the third column part 108 including a step having a depth (L3+L4) with respect to the upper face of the holding part 101 in the area 131, the second column part 107 including a step having a depth (L4) with respect to the upper face of the holding part 101 in the area 126, and the first column part 106 having an upper face that shares a same plane with respect to the upper surface of the holding part 101. Furthermore, the first column part 106 is provided with a through-hole 125 for forming the through-hole electrode 111.

Accordingly, the step having the depth L4 is formed between the first column part 106 and the second column part 107, the step having the depth L3 is formed between the second column part 107 and the third column part 108, and the step having the depth L2 is formed between the third column part 108 and the fourth column part 109. It is to be noted that the depths L1–L4 may be formed satisfying a relation of L1=L2=L3=L4, or may be formed having different depths, respectively. Furthermore, in a case where the depths L1–L4 satisfy the relation of L1=L2=L3=L4, L1 may be set to, for example, 50 μm. Furthermore, the widths of the first-fourth column parts 106–109 may be formed, for example, in sizes ranging approximately between 15–50 μm.

Figure 70:
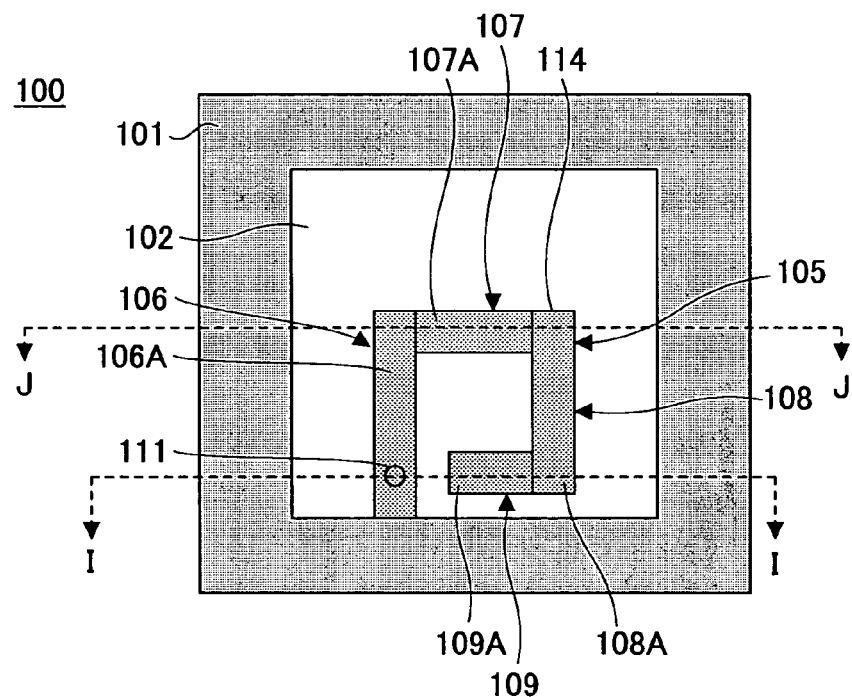
FIG. 70 is a plan view (part 9) showing a process of the manufacture method of a semiconductor inspection device according to a third embodiment of the present invention.
Figure 71:
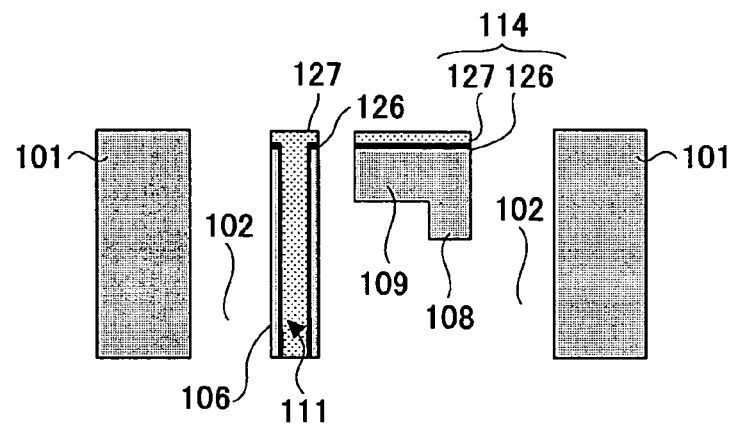
FIG. 71 is a cross-sectional view of a configuration shown in FIG. 70 along line I—I of FIG. 70.
Figure 72:
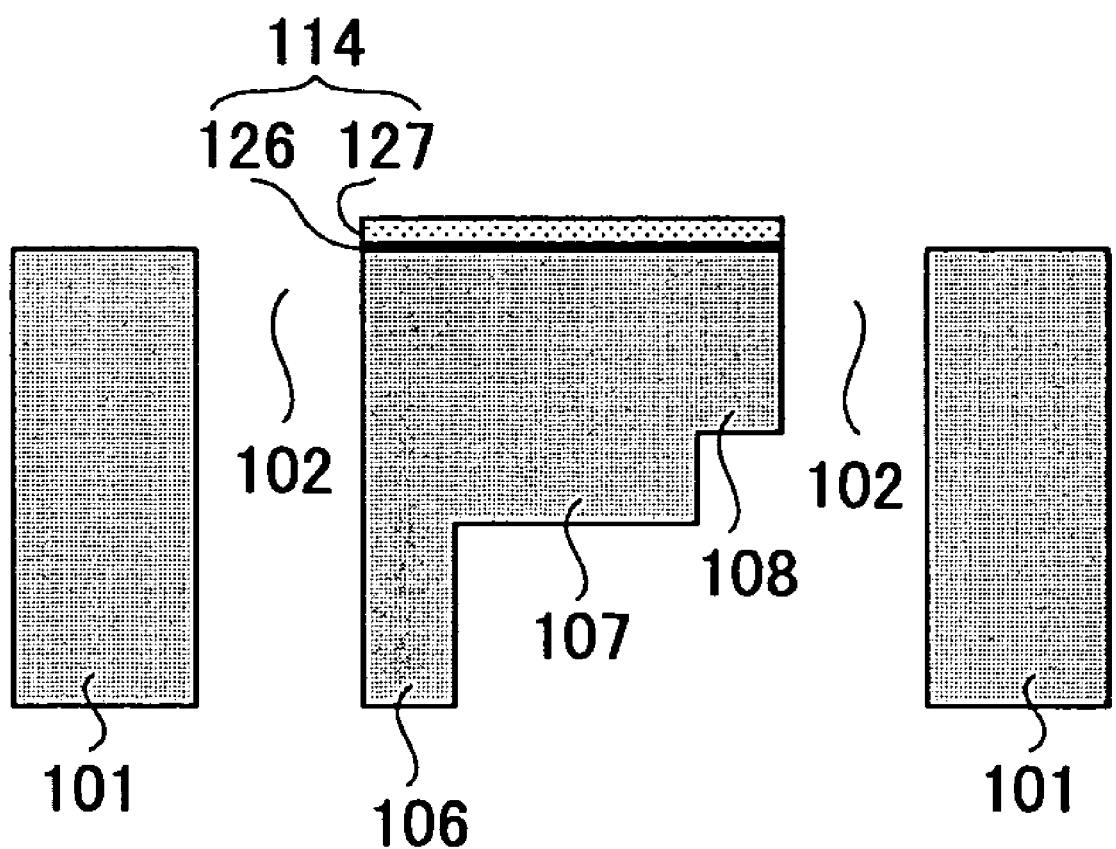
FIG. 72 is a cross-sectional view of a configuration shown in FIG. 70 along line J—J of FIG. 70.

FIG. 70 is a plan view (part 9) showing a process of the manufacture method of the semiconductor inspection device according to the third embodiment of the present invention. FIG. 71 is a cross-sectional view of the configuration shown in FIG. 70 along line I—I of FIG. 70. FIG. 72 is a cross-sectional view of the configuration shown in FIG. 70 along line J—J of FIG. 70.

Next, as shown in FIGS. 70 to 72, after the first resist film 123 is removed, the conductive metal layer 114 including a seed layer 126 and a metal plating film 127 is formed on the bottom face parts 106A–109A of the first-fourth column parts 106–109, and the through-hole electrode 111 including the seed layer 126 and the metal plating film 127 is formed in the through-hole 125. For example, a Ti film, a W film, or a Cr film may be employed as the seed layer 126. Furthermore, a film including, for example, a Ni alloy, Cu, and/or gold may be employed as the plating film 127. It is to be noted that, since the processes for forming the conductive metal layer 114 and the through-hole 111 are the same as that of the first embodiment, further description thereof is omitted.

Hence, in manufacturing the semiconductor inspection device 100 with the above-described manufacturing processes, process precision can be improved by employing such photo-etching technique used for processing semiconductor devices or the like, to thereby enable the contact probe(s) 105 to be arranged in a narrower pitch than the conventional contact probe(s). In addition, the contact probe 105 having little plastic deformation can be mass-produced at low cost. It is to be noted that, in the third embodiment, the fourth column part 109 may be integrally formed with the holding part 101. Furthermore, the position of the through-hole electrode (55, 111) is not limited to the position described in the first-third embodiments, but may be formed at any one of the plural column parts.

Accordingly, the present invention provides a semiconductor inspection apparatus including a contact probe and a method for manufacturing the contact probe for improving process precision, enabling contact probes to be disposed in a narrow pitch, and allowing contact probes to be mass produced at low cost.

Further, the present invention is not limited to these embodiments, but various variations and modifications may be made without departing from the scope of the present invention.

The present application is based on Japanese priority application No.2004-009614 filed on Jan. 16, 2004, with the Japanese Patent Office, the entire contents of which are hereby incorporated by reference.

What is claimed is:

1. A semiconductor inspection device for inspecting an electronic device, the semiconductor inspection device comprising:
    a contact probe including a plurality of column parts disposed in continuation, each of the column parts having different height;
    a conductive layer formed at least on the surfaces of the column parts;
    a holding part for holding the contact probe; and
    a through-hole electrode penetrating at least one of the column parts;
    wherein the contact probe and the holding part are integrally formed from a single silicon substrate.

2. The semiconductor inspection device as claimed in claim 1, wherein the column parts are disposed on the silicon substrate in a spiral-like manner when observed from a plan view direction.

3. The semiconductor inspection device as claimed in claim 1, wherein the holding part includes a frame body encompassing the column parts, wherein the frame body is integrally formed with at least one of the column parts of the contact probe, wherein the column parts each have a bottom face part that shares a same plane with respect to a bottom face part of the frame body.

* * * * *